United States Patent
Suwa et al.

(10) Patent No.: US 7,095,117 B2
(45) Date of Patent: *Aug. 22, 2006

(54) SEMICONDUCTOR DEVICE AND AN ELECTRONIC DEVICE

(76) Inventors: Motoo Suwa, c/o Hitachi, Ltd., Intellectual Property Group, New Marunouchi Bldg. 51, Marunouchi 1-chome, Chiyoda-ku, Tokyo 100-8220 (JP); Yuichi Mabuchi, c/o Hitachi, Ltd., Intellectual Property Group, New Marunouchi Bldg. 51, Marunouchi 1-chome, Chiyoda-ku, Tokyo 100-8220 (JP); Atsushi Nakamura, c/o Hitachi, Ltd., Intellectual Property Group, New Marunouchi Bldg. 51, Marunouchi 1-chome, Chiyoda-ku, Tokyo 100-8220 (JP); Hideshi Fukumoto, c/o Hitachi, Ltd., Intellectual Property Group, New Marunouchi Bldg. 51, Marunouchi 1-chome, Chiyoda-ku, Tokyo 100-8220 (JP)

( * ) Notice: Subject to any disclaimer, the term of this patent is extended or adjusted under 35 U.S.C. 154(b) by 25 days.

This patent is subject to a terminal disclaimer.

(21) Appl. No.: 10/939,491

(22) Filed: Sep. 14, 2004

(65) Prior Publication Data
US 2005/0029648 A1   Feb. 10, 2005

Related U.S. Application Data

(63) Continuation of application No. 10/268,700, filed on Oct. 11, 2002, now Pat. No. 6,803,659.

(30) Foreign Application Priority Data
Oct. 18, 2001   (JP)   ............... 2001-320554

(51) Int. Cl.
*H01L 23/48* (2006.01)
(52) U.S. Cl. ............ 257/738; 257/691; 257/698; 257/700; 257/778; 257/780
(58) Field of Classification Search ........ 257/691, 257/698, 700, 778, 780
See application file for complete search history.

(56) References Cited

U.S. PATENT DOCUMENTS 6,369,443 B1 * 4/2002 Baba ............... 257/700
6,396,136 B1 * 5/2002 Kalidas et al. ...... 257/691

FOREIGN PATENT DOCUMENTS

JP   9-22977    1/1997
JP   11-34886   2/1999

* cited by examiner

*Primary Examiner*—Mai-Huong Tran

(57) ABSTRACT

A semiconductor device has a reduced number of external power terminals and is scaled down while suppressing power noise, and an electronic device is efficiently equipped with a bypass condenser. A package substrate has, on its surface, a semiconductor chip having a plurality of output circuits and at least one electrode for supplying a voltage to each of the output circuits, and is provided with external terminals on its back surface and has a plurality of wiring layers.

20 Claims, 23 Drawing Sheets

1) WHERE θ = 90°

2) WHERE θ < 90°

3) WHERE 90° < θ < 270°

VddQ / Vss POWER SUPPLY PAIRS : 31 PAIRS ( INITIAL STATE )

VddQ / Vss POWER SUPPLY PAIRS : 4 PAIRS

BYPASS CONDENSER

SEMICONDUCTOR DEVICE AND AN ELECTRONIC DEVICE

The above-referenced patent application is a continuation application of U.S. Ser. No. 10/268,700 filed Oct. 11, 2002 now U.S. Pat. No. 6,803,659, from which priority is claimed under 35 U.S.C. § 120.

BACKGROUND OF THE INVENTION

The present invention relates to a semiconductor device and an electronic device, and mainly to a semiconductor device having a BGA (Ball Grid Array) structure and a technology effective for application to a power supply technique of an electronic device equipped with the semiconductor device.

It has been reported that Unexamined Patent Publication No. Hei 9(1997)-22977 (hereinafter called Reference 1) and Unexamined Patent Publication No. Hei 11(1999)-324886 (hereinafter called Reference 2) exist as ones considered to be those related to the invention of the present application as a result of investigations of the known examples subsequent to the completion of the invention of the present application. Reference 1 has proposed a BGA structure wherein signal pads, ground pads and power pads are alternately disposed and wires are made substantially parallel and approximately identical in length to thereby reduce noise or the like. Power and ground wires are intensively provided between internal and external terminals to thereby reduce the number of the external terminals. In Reference 2, rewiring layers are used on a chip to form plane layers, and the plane layers are used to unify wirings, thereby reducing the number of flip-chip bumps on the semiconductor chip.

As a technology of reducing external power terminals with respect to power supply electrodes provided for the semiconductor chip, there is known a technology of a bus bar comprised of a lead frame used in a DRAM or the like. In the bus bar technology, a plurality of power supply pads are provided for a semiconductor chip and respectively bonded onto one lead frame by bonding wires to thereby reduce the number of the external power terminals. Namely, the lead frame is used as part of power wirings.

SUMMARY OF THE INVENTION

A semiconductor device needs relatively large current drive capability to drive, at high speed, a load such as relatively large parasitic capacitance added to its corresponding output terminal when a printed circuit board is equipped with the semiconductor device. It is known that when an output circuit for causing such a large current to flow is provided, large noise is produced in a power terminal of the output circuit. In order to reduce the occurrence of such large noise, there is a need to suppress power impedance as low as practicable. In order to avoid the transfer of the power noise produced in the output circuit to other circuits, a power supply line of the output circuit and power supply lines for an input circuit and an internal circuit are separated from one another on a semiconductor chip, and power pads are provided in association with their lines.

A package having a BGA structure can be provided with a large number of external terminals. Particular awareness of a problem about the assignment of external terminals in a one-to-one correspondence with power supply pads provided for the semiconductor chip was not in existence. If mentioned in reverse, the external terminals are respectively assigned in the one-to-one correspondence with the power supply pads provided for the semiconductor chip, so that preference is given to the fact that voltages are transferred to the power supply pads of the semiconductor chip from the printed circuit board via the external terminals, a parasitic inductance component that contributes to the occurrence of the noise, is greatly reduced to thereby suppress the occurrence of the noise, and in addition noise from the output circuit side is prevented from being transferred to the internal circuit and the input circuit.

When considered in terms of the power noise, for example, the parasitic inductance increases in reverse although the above technology using the bus bar is capable of reducing the number of external terminals. In a package of a DRAM, an inductance component of a bonding wire is about 1 nH. On the other hand, an inductance component of a lead frame is about 4 nH. Assuming that five ground pads exist in the semiconductor chip with respect to one bus bar, for example, the combined inductance at the bonding wire portion can be reduced to $\frac{1}{5}$ nH but the inductance of the lead frame 4 nH exists as it is because one lead frame is commonly used. Therefore, the total inductance is not improved like $\frac{1}{5}+4=4.2$ nH. On the other hand, when a lead and an external terminal are provided in a one-to-one correspondence with each ground pad of the semiconductor chip, the inductance can be reduced like $(1+4)/5=1$ nH.

With advances in micro-fabrication of a device, however, the scale of a circuit formed on one semiconductor chip increases and correspondingly the number of external terminals has a tendency to increase. The increase in the number of the external terminals becomes insignificant so far owing to the micro-fabrication or the like of the device on the semiconductor chip side. However, a package substrate equipped therewith needs to use one large in size in association with the increase in the number of the external terminals, so that the cost of the package substrate increases and the size of a semiconductor device per se also increases, thus causing a problem that becomes the factor that interferes with downsizing of an electronic device. References 1 and 2 referred to above perfectly lack consideration for a parasitic inductance component in a power supply path and consideration for noise produced in the output circuit. They do not show any suggestion for solving the problem about the power noise.

An object of the present invention is to provide a semiconductor device which reduces the number of external power terminals while suppressing power noise. Another object of the present invention is to provide a semiconductor device which realize its scale down while suppressing power noise. A further object of the present invention is to provide an electronic device efficiently equipped with a bypass condenser. The above, other objects and novel features of the present invention will become apparent from the description of the present specification and the accompanying drawings.

A summary of a typical one of the inventions disclosed in the present application will be described in brief as follows: A package substrate is provided which is equipped, on its surface, with a semiconductor chip having a plurality of output circuits each outputting a signal formed by an internal circuit, a first voltage supply electrode which supplies an operating voltage to the internal circuit, and a plurality of second voltage supply electrodes which supply operating voltages to the plurality of output circuits, and which is provided on its back surface, external terminals and has a plurality of wiring layers, and a first electrode having one end connected to the first voltage supply electrode of the semiconductor chip, a plurality of second electrodes having one ends respectively connected to the plurality of second voltage supply electrodes, first wiring means which includes a wiring layer different from the surface wiring layers and commonly connects the second electrodes respectively, second wiring means which connects the first electrode and a corresponding one of the external terminals provided on the back surface, and a plurality of third wiring means which respectively connect the first wiring means and a plurality of external terminals equivalent to a number aggregated to a number fewer than the second electrodes provided on the back surface are provided on the surface of the package substrate.

A summary of another typical one of the inventions disclosed in the present application will be described in brief as follows: A printed circuit board is provided which is equipped, on its surface, with a semiconductor device having a plurality of power terminals which supply operating voltages, and a plurality of ground terminals each of which supplies a circuit ground potential, and which is provided with a bypass condenser on its back surface, and a plurality of first electrodes having one ends respectively connected to the plurality of power terminals of the semiconductor device, a plurality of second electrodes having one ends respectively connected to the plurality of ground terminals of the semiconductor device, first wiring means which includes a wiring layer different from a wiring layer formed with the first electrodes and commonly connects the first electrodes, second wiring means which commonly connects the second electrodes, third wiring means which connects the first wiring means and third electrodes equivalent to a number aggregated to a number fewer than the first electrodes provided on the back surface, fourth wiring means which connects fourth electrodes equivalent to a number aggregated to a number fewer than the second electrodes, and a bypass condenser provided between each of the third electrodes and each of the fourth electrode are provided on the surface of the printed circuit board.

There is provided an electronic device comprising a semiconductor device, and a printed circuit board equipped with the semiconductor device mounted on its surface and provided with a bypass condenser on its back surface, wherein the semiconductor device includes a plurality of power terminals which supply operating voltages, and a plurality of ground terminals each of which supplies a circuit ground potential, and wherein the printed circuit board includes a plurality of first electrodes provided on a substrate surface equipped with the semiconductor device and having one ends respectively connected to the plurality of power terminals of the semiconductor device, a plurality of second electrodes provided on the substrate surface equipped with the semiconductor device and having one ends respectively connected to the plurality of ground terminals of the semiconductor device, first wiring means which includes a wiring layer different from a wiring layer formed with the first electrodes and commonly connects the first electrodes, second wiring means which includes a wiring layer different from a wiring layer formed with the second electrodes and commonly connects the second electrodes, third wiring means which connects the first wiring means and third electrodes equivalent to a number aggregated to a number fewer than the first electrodes provided on the back surface, fourth wiring means which connects the second wiring means and fourth electrodes equivalent to a number aggregated to a number fewer than the second electrodes provided on the back surface, and a bypass condenser provided between each of the third electrodes and each of the fourth electrode.

According to the electronic device, the semiconductor device includes external terminals each of which is of a grid array type.

DETAILED DESCRIPTION OF THE PREFERRED EMBODIMENTS

Figure 1:
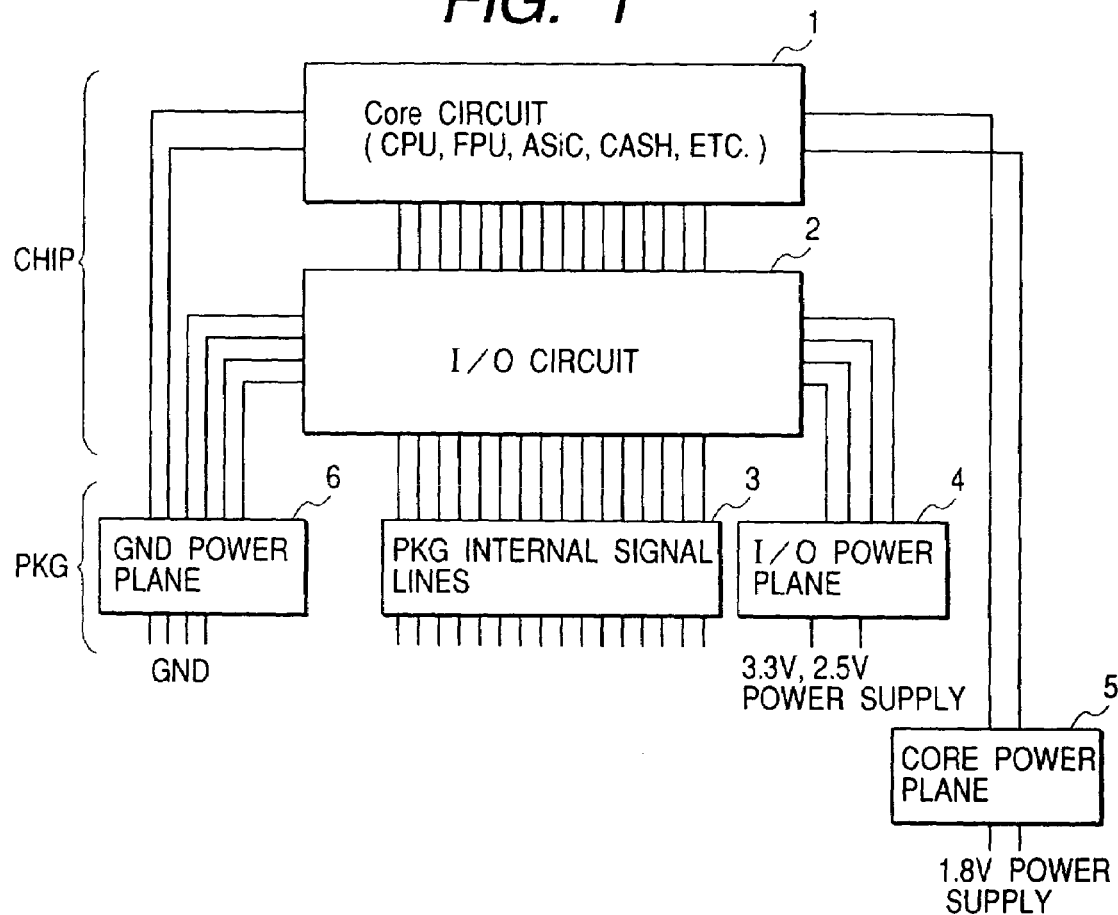
FIG. 1 is a block diagram showing one embodiment of a semiconductor device according to the present invention.

A block diagram of one embodiment of a semiconductor device according to the present invention is shown in FIG. 1. The semiconductor device showing the present embodiment is intended for a flip-chip type BGA package. The present block diagram is different from a block diagram of a general semiconductor device. A wiring unit of a PKF (Package) section is also shown together in addition to an electronic circuit constituted of a semiconductor chip section.

The semiconductor chip section comprises a core circuit 1, and an I/O circuit 2. The core circuit 1 constitutes an internal circuit and is made up of a logical circuit or the like. While the I/O circuit 2 means an input/output circuit in general, the I/O circuit 2 employed in the present embodiment indicates an output circuit.

The PKG section comprises PKG internal signal lines 3 for connecting between the I/O circuit 2 and external terminals, and a power supply system for supplying operating voltages to the internal circuit 1 and the I/O circuit 2. Although not restricted in particular, the power supply system comprises a Core power plane 5 for supplying an operating voltage of 1.8V to the internal circuit 1, an I/O power plane 4 for supplying operating voltages of 3.3V and 2.5V, respectively, to the I/O circuit, and a GND power plane 6 for supplying a circuit ground potential GND to the internal circuit 1 and the I/O circuit 2.

The semiconductor device according to the present embodiment has a 1.8V Core circuit power supply and 3.3V and 2.5V I/O power supplies as power supplies as described above. Their power pins pair up with ground pins GND respectively. This does not means that 3.3V and 2.5V must be supplied to their corresponding 3.3V and 2.5V I/O power terminals employed in the present embodiment as described above. When the semiconductor device performs transfer of data from and to other semiconductor device or the like operated at 3.3V, for example, 3.3V is supplied to the 2.5V terminal and all the I/O circuits may be operated as 3.3V interface circuits. When the semiconductor device performs transfer of data from and to other semiconductor device operated at 2.5V in reverse, 2.5V is supplied to the 3.3V terminal and all the I/O circuits may be operated as 2.5V interface circuits.

If the two power systems of 3.3V and 2.5V are prepared as described above, then a system can be constructed in combination with the two types of semiconductor devices having two 3.3V and 2.5V interfaces, and a system unified in the form of 3.3V or 2.5V can be made up in addition to it, thereby making it possible to cause applications of the semiconductor device to have flexibility.

The internal circuit 1 may preferably be operated at a low voltage like 1.8V to achieve scale-down and low power consumption of each element and speed up its operation. It is not always necessary to set the voltage for the internal circuit 1 lower than voltages different from those for the I/O circuit, i.e., the power supply voltages of the I/O circuit 2. Voltages identical to those for the I/O circuit 2 may be supplied. However, power supply lines, power pads corresponding thereto, and wirings (planes) lying within PKG and external terminals are respectively provided separately from power supply paths associated with the I/O circuit 2 to avoid the influence of noise produced upon an output operation of the I/O circuit 2. When the low-voltage like such 1.8V as described above is used in the internal circuit 1, the power supply voltage 3.3V or 2.5V for the I/O circuit 2 may be reduced to form a step-down or deboosted voltage like 1.8V referred to above by means of an internal power supply circuit.

Figure 2:
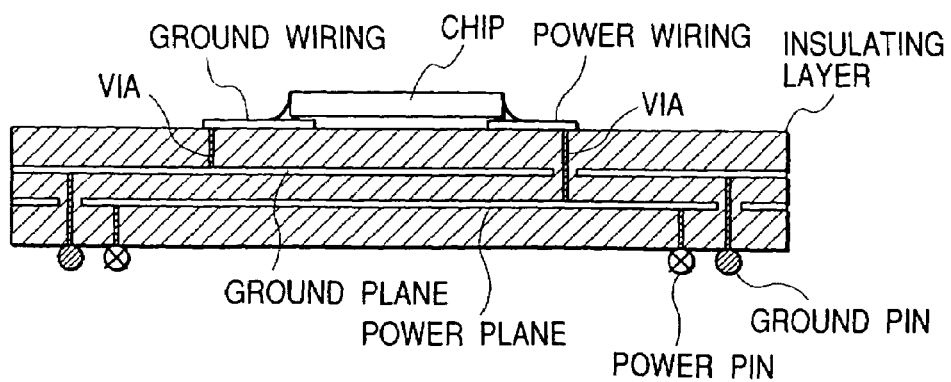
FIG. 2 is a schematic cross-sectional view illustrating one embodiment of a semiconductor device having a BGA structure, according to the present invention.

A schematic cross-sectional view of one embodiment of a semiconductor device having a BGA structure, according to the present invention is shown in FIG. 2. A semiconductor chip is mounted on the side of one main surface of a mounting substrate (package substrate). External terminals of the semiconductor device are disposed on the side of the other main surface (back surface) of the package substrate. The semiconductor chip is made up of a so-called bare chip and has such a plurality of bump electrodes as being face-mountable to the package substrate.

Although not restricted in particular, the semiconductor chip may be configured, as needed, by such a technology as referred to as an area array pad, i.e., such a technology as to form wirings for enabling relocation of pad electrodes on a semiconductor chip with completed elements and wirings through such an insulating film as composed of a polyimide resin and form the corresponding pad electrodes for such wirings. By virtue of the area array pad technology, the pad electrodes arranged with a relatively small pitch ranging from several tens of μm to 100 μm, which are used as external terminals in the semiconductor chip, are respectively set so as to range from 0.1 mm to 0.2 mm in diameter and transformed into bump electrode arrays each disposed with a relatively large pitch ranging from 400 μm to 600μ.

The package substrate includes an insulating substrate formed of glass epoxy or glass, such relatively fine internal wirings as made up of a multilayer wiring structure formed on the insulating substrate, a plurality of lands (connecting electrodes) electrically connected to their corresponding bump electrode of the semiconductor chip, and a plurality of external terminals. The package substrate, more preferably, the main surface on the mounting side of the semiconductor chip is coated with an insulating protective film composed of an organic resist material except for the tops of the lands.

The external terminals are respectively made up of bump electrodes electrically connected to their corresponding internal wirings via holes defined in the insulating substrate. The bump electrodes in the semiconductor chip are respectively set to such relatively small sizes and relatively small pitches that they may be referred to as microbumps, whereas the bump electrodes used as the external terminals on the package substrate are respectively set to relatively large sizes and relatively large pitches. The semiconductor chip is mounted on the package substrate by a face mounting technology. A protective material called so-call under fill is charged between the face-mounted semiconductor chip and package substrate.

In the present embodiment, the pair of power supply paths is illustratively shown as typical. Ground and power-supply electrodes of the semiconductor chip are face-mounted to their corresponding ground wirings and power-supply wirings (lands) of the package substrate. The ground wirings provided on the package surface are connected to a ground plane via contact holes (via). Similarly, the power-supply wirings are also connected to a power plane formed of a wiring layer, which is different from the ground plane, through via similar to the above. The ground plane and power plane, and bump electrodes used as ground and power pins provided on the back surface of the package substrate are respectively connected to one another via the contact holes.

Figure 3:
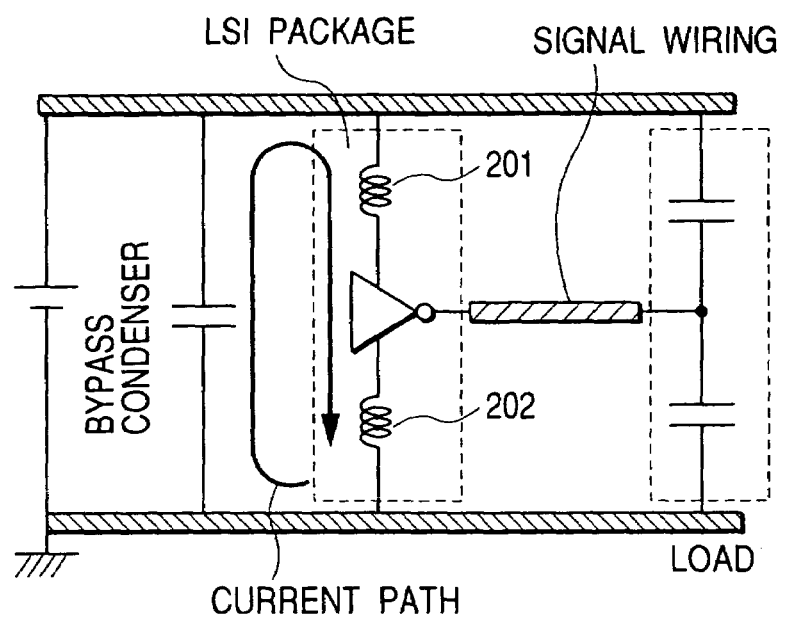
FIG. 3 is an equivalent circuit diagram for describing power noise according the present invention.

An equivalent circuit diagram for describing power noise according to the present invention is shown in FIG. 3. The same drawing is intended for a through current mode of the output circuit. In a semiconductor device according to this embodiment, a bypass condenser for power-supply voltage stabilization is provided between a power-supply voltage and a circuit ground potential, a signal wiring is connected to an output terminal of the output circuit, and parasitic capacitances as a load (LOAD) exist.

The power-supply voltage is commonly used on the power plane conductor and set as an identical potential. An operating voltage is transferred from this conductor plane to the output circuit of the semiconductor chip via a wiring, a chip electrode and an in-chip wiring on the above package substrate. Similarly, the circuit ground potential is also commonly used on the ground plane conductor and set as identical potential. It is transferred from this conductor plane to the output circuit of the semiconductor chip via the corresponding wiring, chip electrode and internal wiring on the above package substrate.

In the same drawing, reference numeral 201 indicates a parasitic inductance component at the power-supply voltage supply paths, and reference numeral 202 indicate a parasitic inductance component at a ground potential supply path of the circuit. When a current flows through these parasitic inductances, power noise is generated. In the same drawing, the through current mode means a current that flows between the power-supply voltage and the circuit ground potential where a P channel MOSFET and an N channel MOSFET are simultaneously brought into an on state in a CMOS output circuit when an input signal of the output circuit changes from a low level to a high level or the high level to the low level.

Figure 4:
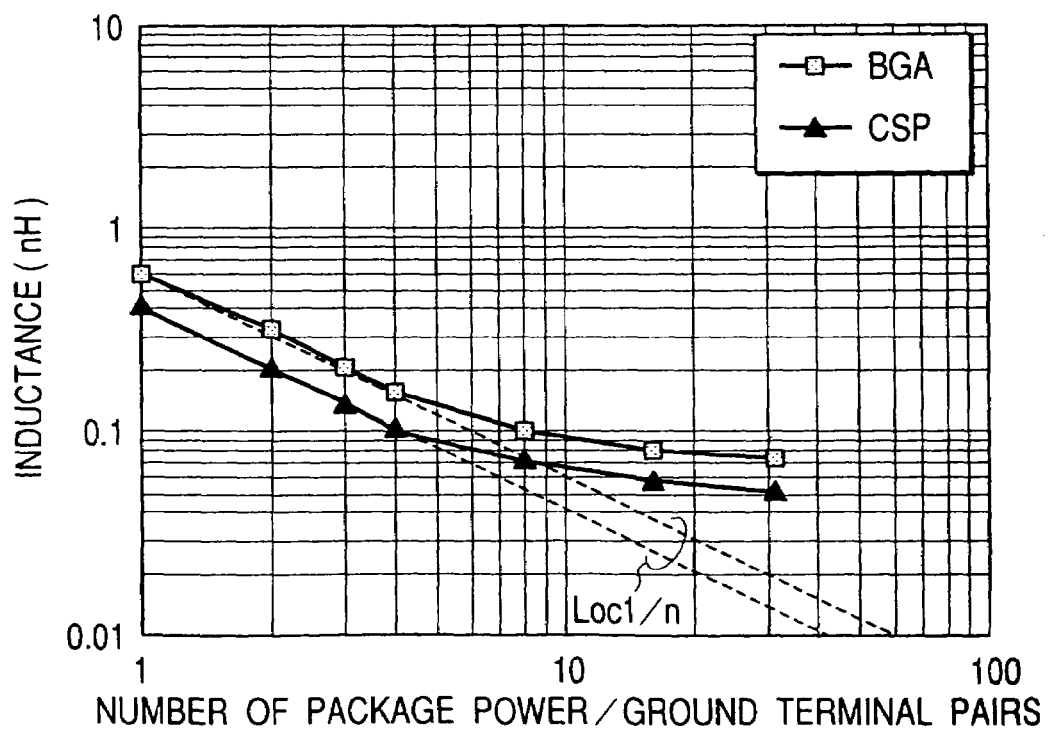
FIG. 4 is a characteristic diagram of effective inductances at power supply paths in a through current mode in FIG. 3.

A characteristic diagram illustrative of effective inductances at the power supply paths in the through current mode is shown in FIG. 4. In the same drawing, the vertical axis indicates an inductance component, and the horizontal axis indicates the number of package power/ground terminal pairs, respectively. Namely, the same drawing shows the relationship between the number of the power supply bump electrodes provided on the back surface of the BGA package and effective inductance at that time.

As the number of terminal pairs increases as in the case of one pair to a four pair, the inductance component is reduced. It is however understood that even if the number of terminal pairs increases as in the case of 5 to 10 pairs and further increases as in the case of 20 or 30 pairs, the inductance component is not reduced so far. Namely, it is understood that it is useless to increase the number of external terminals so far in order to reduce noise in the through current mode.

Figure 5:
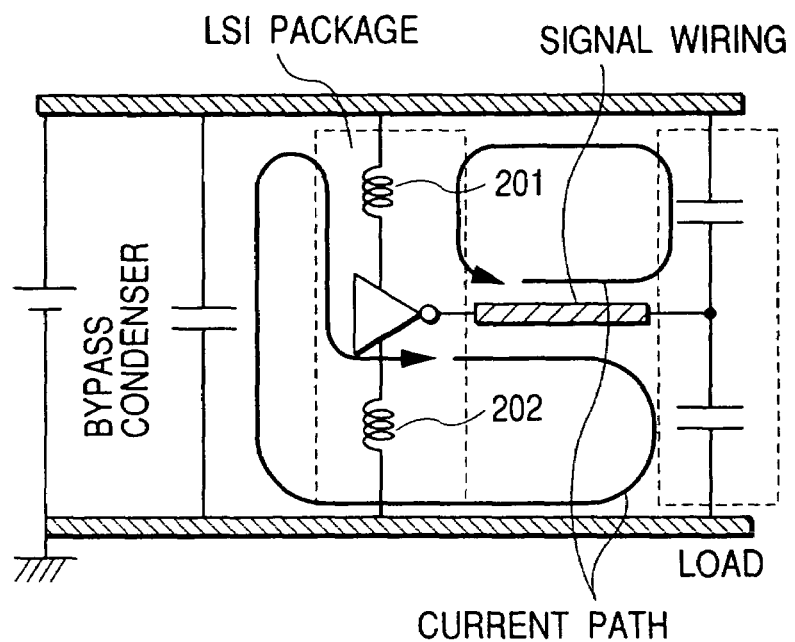
FIG. 5 is an equivalent circuit diagram for described power noise according to the present invention.

An equivalent circuit diagram for describing power noise according to the present invention is shown in FIG. 5. The same drawing is intended for a load charge mode of an output circuit. The load charge mode is a mode considering a current path when the output of the output circuit changes from a low level to a high level in response to a change of an input signal from a high to a low levels. An effective inductance of a package, which contributes to the generation of noise, results in an inductance 201 on the power supply side.

Figure 6:
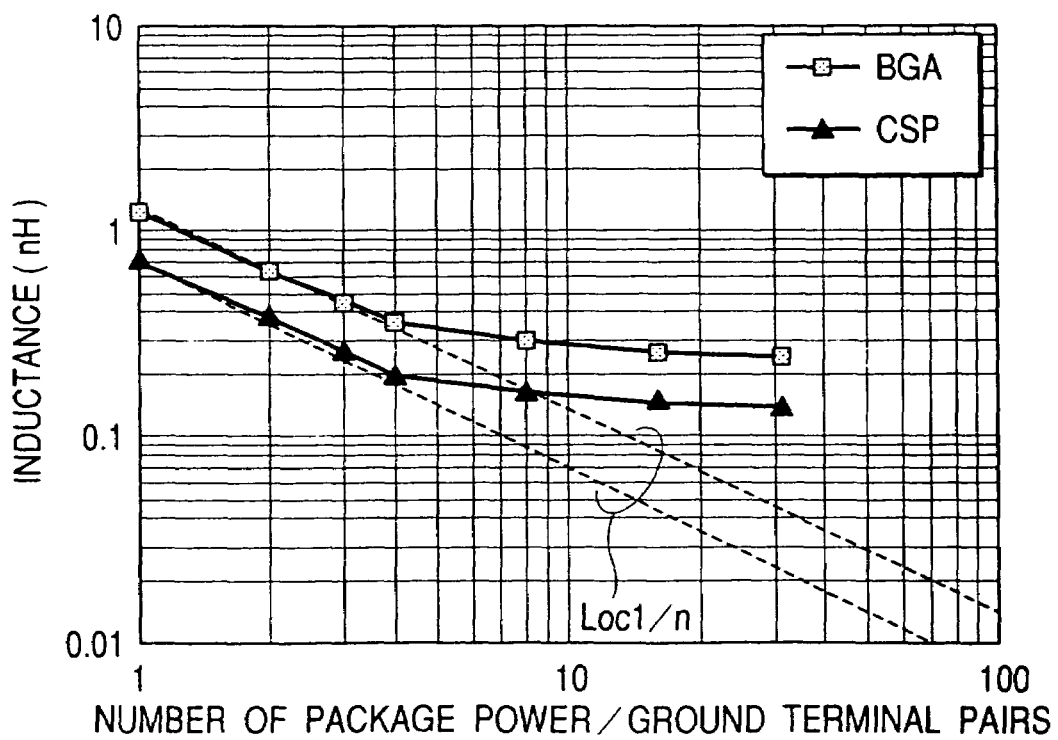
FIG. 6 is a characteristic diagram of effective inductances at the power supply paths in a load charge mode in FIG. 5.

A characteristic diagram illustrative of effective inductances at the power supply paths in the load charge mode is illustrated in FIG. 6. As the number of terminal pairs increases as in the case of one pair to a four pair, the inductance component is reduced. It is however understood that even if the number of terminal pairs increases as in the case of 5 to 10 pairs and further increases as in the case of 20 or 30 pairs, the inductance component is not reduced so far. Namely, it is understood that it is useless to increase the number of external terminals so far in order to reduce noise in the above-described load charge mode.

Figure 7:
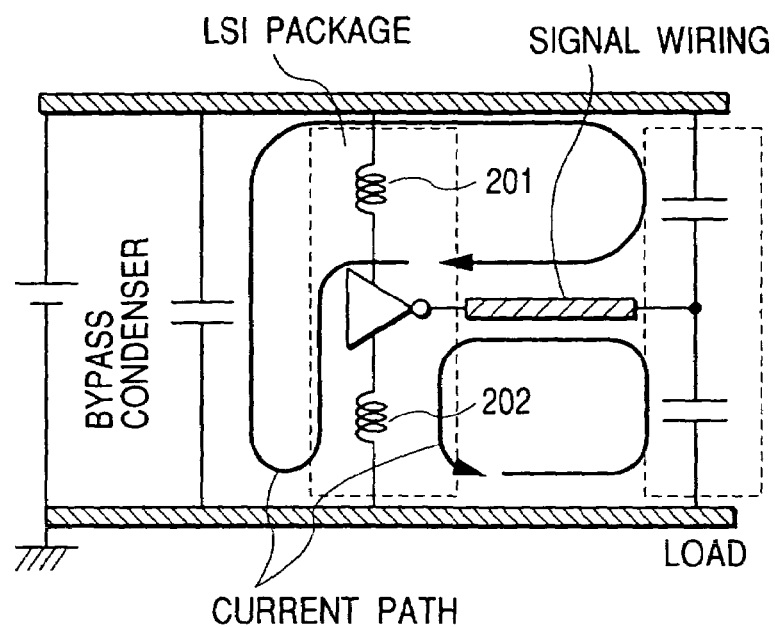
FIG. 7 is an equivalent circuit diagram for describing power noise according to the present invention.

An equivalent circuit diagram for describing power noise according to the present invention is shown in FIG. 7. The same drawing is intended for a load discharge mode of an output circuit. The load discharge mode is a mode considering a current path when the output of the output circuit changes from a low level to a high level in response to a change of an input signal from a high to a low levels. An effective inductance of a package, which contributes to the generation of noise, results in an inductance 202 on the ground potential side.

Figure 8:
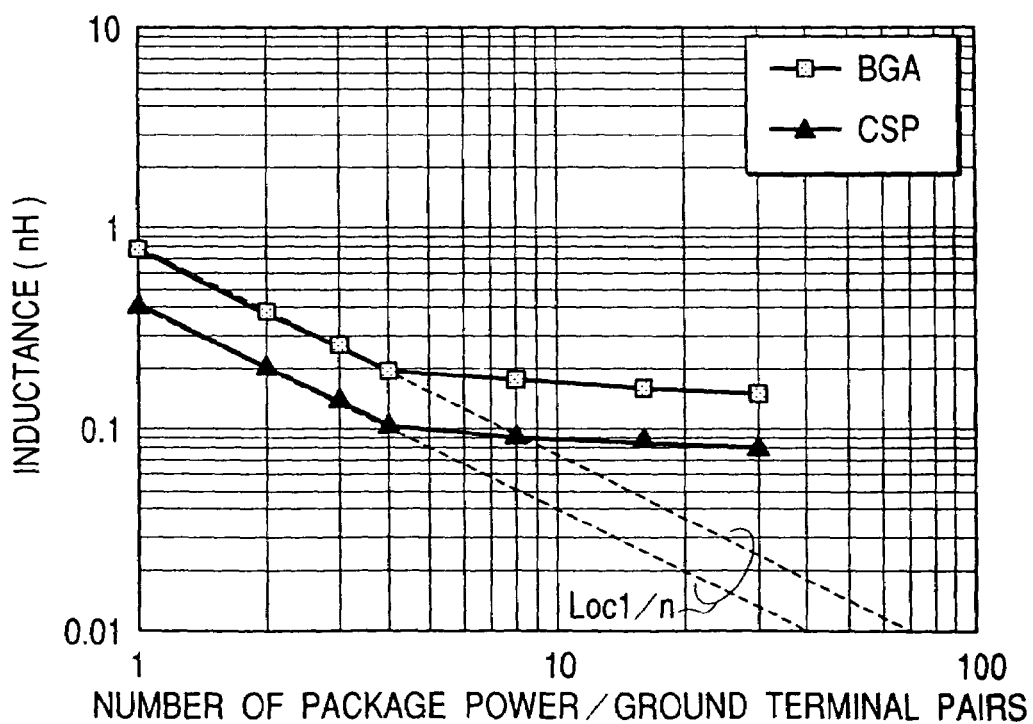
FIG. 8 is a characteristic diagram of effective inductances at power supply paths in a load discharge mode in FIG. 7.

A characteristic diagram illustrative of effective inductances at the power supply paths in the load discharge mode is illustrated in FIG. 8. As the number of terminal pairs increases as in the case of one pair to a four pair, the inductance component is reduced. It is how-ever understood that even if the number of terminal pairs increases as in the case of 5 to 10 pairs and further increases as in the case of 20 or 30 pairs, the inductance component is not reduced so far. Namely, it is understood that it is useless to increase the number of external terminals so far in order to reduce noise in the above-described load charge mode.

Figure 9:
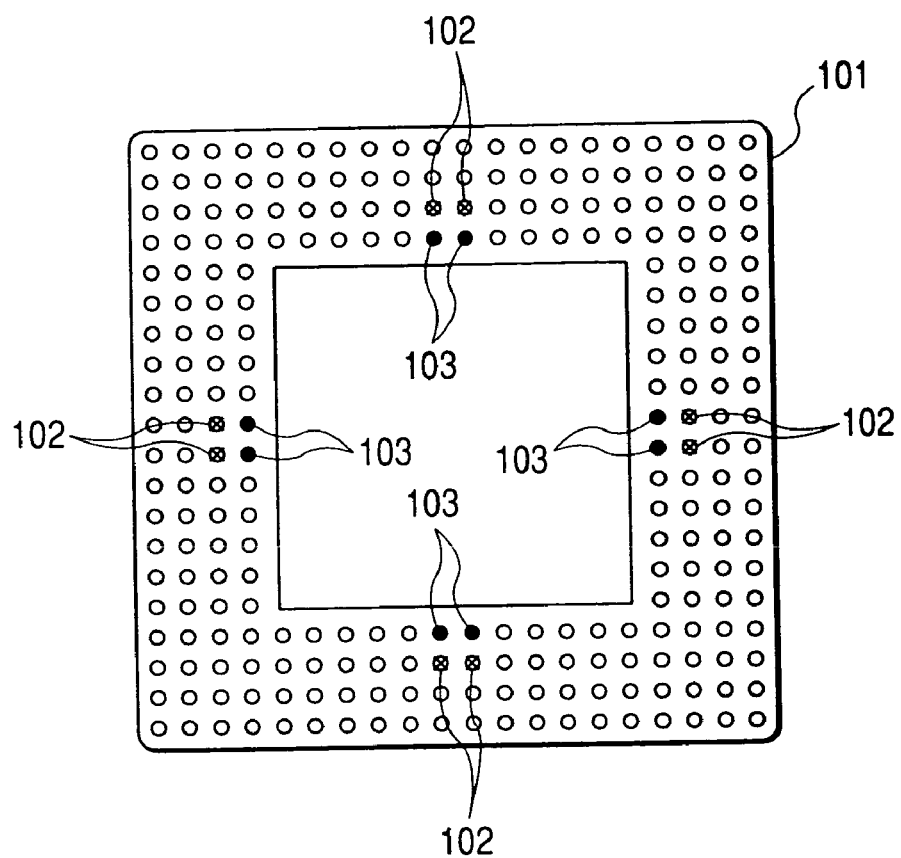
FIG. 9 is a schematic back side view showing one embodiment of a semiconductor device according to the present invention.

A schematic back side view of one embodiment of a semiconductor device according to the present invention is shown in FIG. 9. External terminals comprising such bump electrodes as described above are provided on the back surface of the semiconductor device 101. In the present embodiment, pairs of power pins 102 and ground pins 103 for respectively supplying a power-supply voltage and a ground potential to the output circuit formed in a semiconductor chip are provided inside respective central portions of four sides of the chip two pairs by two pairs as eight pairs of power and ground pins in total. Namely, since the rate of reduction in the inductance component that contributes to the generation of noise is extremely reduced in the case of four pairs or more as described above, the eight pairs are provided as described above as such a range as not to cause an increase in the number of the external terminals wastefully.

Incidentally, while power pins for the internal circuit (Core) are also provided in addition to power pins for the above-described I/O circuit as the power pins as in the first embodiment, they are omitted in the same drawing because the generation of noise in their power supply paths is low. Namely, although a large number of gate circuits perform switch operations in the internal circuit, the current as seen on the whole can be assumed to be a substantially dc current. Therefore, even if the inductance component of each power path in the internal circuit becomes greater than the inductance component of each power path of the I/O circuit, only such a current as assumed to be the dc current as described above flows, thereby no resulting in the generation of noise.

In a semiconductor device like an LSI (Large Scale Integration), a variation in current consumption of the LSI and a potential variation produced due to the inductance of a package, i.e., power noise contribute to an LSI malfunction. Therefore, the power system of the conventional BGA package is designed so as to suppress the inductance of the package per se as low as practicable. Namely, power terminals are respectively provided in a substantially one-to-one correspondence to pads of the power system provided for a semiconductor chip. As a result, there is also proposed a product in which power-supply voltage and ground terminals account even for about 30 percent of all bump electrodes in a BGA package.

While it is desired that electronic parts are scaled down and their packaging is brought into high density, the numbers of power supplies and ground terminals taken up in the BGA package are becoming innegligible existence. Therefore, the inventors of the present application have carried out detailed discussions about the inductance of the power system in the through current mode, load charge mode and load discharge mode, thus obtaining a solution that if four pairs are provided even at minimum, then the effective inductance component can be restrained to a problem-free degree.

In a semiconductor device constituting a microprocessor CPU such as shown in FIG. 1, for example, the number of pads (electrodes) on the semiconductor chip side reaches 457 pins in total, which comprise 330 signal pins, 70 ground pins, 8 core power pins, 22 2.5V I/O power pins, and 27 3.3V I/O power pins. On the other hand, the number of bump electrodes (external terminals) on the BGA side results in 384 pints corresponding to four-row turnaround of 28 outermost peripheral pins. Of these, signal pins can be configured as 330 in number, ground pins can be intensively configured as 16 in number, core power pins can be configured as 8 in number, 2.5V I/O power pins can be intensively configured as 4 in number, 3.3V I/O power pins can be intensively configured as 6 in number, and others can be configured as NC pins, respectively. When a pin pitch is 1 mm, a package size can be scaled down to about 29-mm bore diameter or gauge.

Incidentally, when the bump electrodes are provided 457 in number as equivalent to the number of pads (electrodes) of a semiconductor chip as in the conventional BGA package, the outermost peripheral pins result in 33 pins upon 4-row turnaround, and the package size results in about 34-mm bore diameter or gauge upon a 1-mm pitch. Namely, a package size shrink of about 5 mm is enabled by using the technology of the present invention while equivalent performance is being maintained.

When a current flows in a given conductor in a density of j(r), magnetic energy Em stored in space containing the conductor is expressed in the following equation (1):

$$E_m = \frac{\mu}{4\pi} \int\int \frac{j(r) \cdot j(r')}{|r - r'|} dr dr'$$

(This r indicates volume integration)

Figure 10:
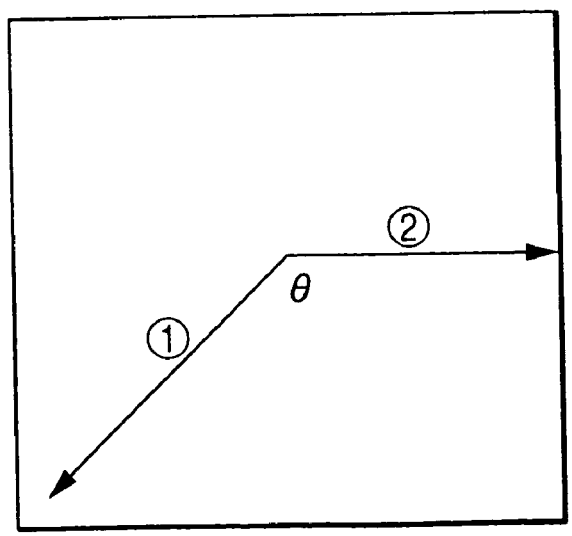
FIG. 10 is an explanatory view illustrating current paths for describing the present invention.

An explanatory view of current paths for describing the present invention is illustrated in FIG. 10. When current paths ① and ② separated from each other at an arbitrary angle exist as shown in the same drawing, the equation (1) can be divided into a component ascribable to the current path ①, a component ascribable to the current path ②, and an interaction component between the current paths ① and ② as the following equation (2):

$$E_{m1} = \frac{\mu}{4\pi} \int\int \frac{j(r_1) \cdot j(r'_1)}{|r_1 - r'_1|} dr_1 dr'_1 \ldots \text{field}$$ [Equation 2]

energy of current path ①

$$E_{m2} = \frac{\mu}{4\pi} \int\int \frac{j(r_2) \cdot j(r'_2)}{|r_2 - r'_2|} dr_2 dr'_2 \ldots \text{field}$$

energy of current path ②

$$E_{m12} = \frac{\mu}{4\pi} \int\int \frac{j(r_1) \cdot j(r'_2)}{|r_1 - r'_2|} dr_1 dr'_2 \ldots \text{mutual}$$

energy of current paths ① and ②

When an equal amount of current I flows through the current paths ① and ②, the respective magnetic field energy are expressed in the equation (2) and hence their inductances are represented by the following equation (3):

From $Em = LxIxI$, [Equation 3]

$$L1 = \frac{\mu}{4\pi} \int\int \frac{i_1(r_1) \cdot i_2(r'_1)}{|r_1 - r'_1|} dr_1 dr'_1 \ldots \text{inductance}$$

of current path ①

$$L2 = \frac{\mu}{4\pi} \int\int \frac{i_2(r_2) \cdot i_2(r'_1)}{|r_2 - r'_2|} dr_1 dr'_1 \ldots \text{inductance}$$

of current path ②

$$M12 = \frac{\mu}{4\pi} \int\int \frac{i(r_1) \cdot i(r'_2)}{|r_1 - r'_2|} dr_1 dr'_2 \ldots \text{mutual}$$

inductance of current paths ① ② where i1 and i2 respectively indicate unit direction vectors of the current paths ① and ②.

Figure 11:
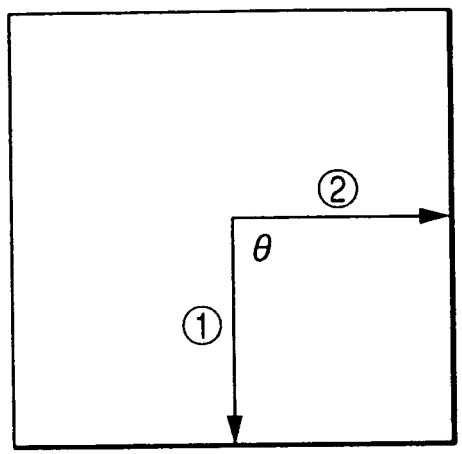
FIG. 11 is an explanatory view showing current paths for describing the present invention.
Figure 11:
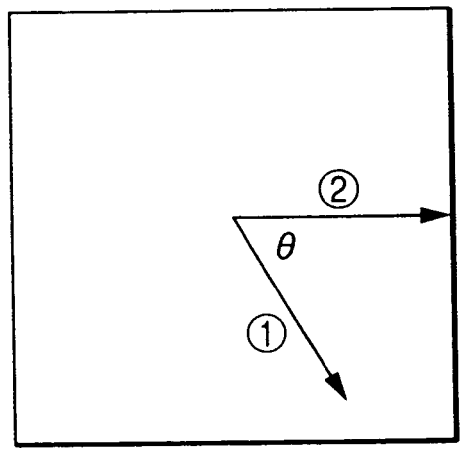
Figure 11:
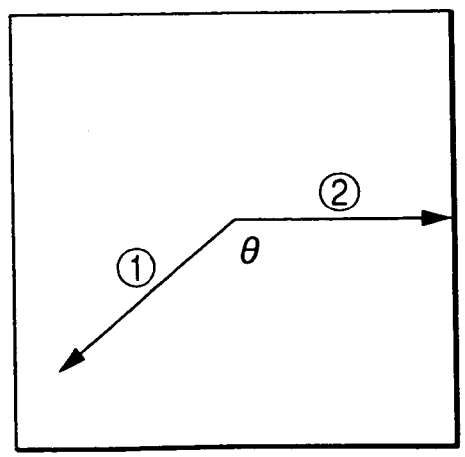

An explanatory view of current paths for describing the present invention is illustrated in FIG. 11. The same drawing shows where 1) the angle Θ between the current paths ① and ②: 1) Θ=90°, 2) Θ<90° and 3) 90°<Θ<270°.

When 1) Θ=90°, the inner product of the direction vector i (r1) of the current path ① and the direction vector i (r2) of the current path ② always results in zero (0). Namely, the relation in the following equation (4) is established:

$$i(r_1) \cdot i(r'_2) = 0$$ [Equation 4]

Thus, the inductance L1 ascribable to the current path ①, and the inductance L2 ascribable to the current path ② are independent of each other. Namely, the mutual inductance M12 results in 0. Thus, the total inductance is expressed in the following equation (5):

$$L = \frac{L1 \cdot L2}{L1 + L2} \quad \text{[Equation 5]}$$

When 2) Θ<90°, the inner product of the direction vector i (r1) of the current path ① and the direction vector i (r2) of the current path ② always results in >0. Thus, the mutual inductance M12 becomes positive and hence the total inductance is expressed in the following equation (6):

$$L = \frac{L1 \cdot L2}{L1 + L2} + M12 \quad \text{[Equation 6]}$$

When 3) 90°<Θ<270°, the inner product of the direction vector i (r1) of the current path ① and the direction vector i (r2) of the current path ② always results in <0. Thus, the mutual inductance M12 becomes negative and hence the total inductance is expressed in the following equation (7):

$$L = \frac{L1 \cdot L2}{L1 + L2} - M12 \quad \text{[Equation 7]}$$

From the equation (7), the inductance decreases as compared with Θ=90°. However, since the distance is put between the current paths, M12 is small.

In summary, when the angle is shifted like 0°→90°→180°→270° and power pins are provided up to four pairs in the BGA package, the mutual inductance between the current paths does not exist in the case of Θ=90° and 270°, and M12 can be regarded as 0 since the distance between the current paths is put away in the case of Θ=180°. Therefore, the inductance decreases in proportion to the number of installed pins. Since the current paths that bring about Θ<90°, exist when the number of pins exceeds 4, the reduction in inductance is not proportional to the number of pins due to the mutual inductance.

Figure 12:
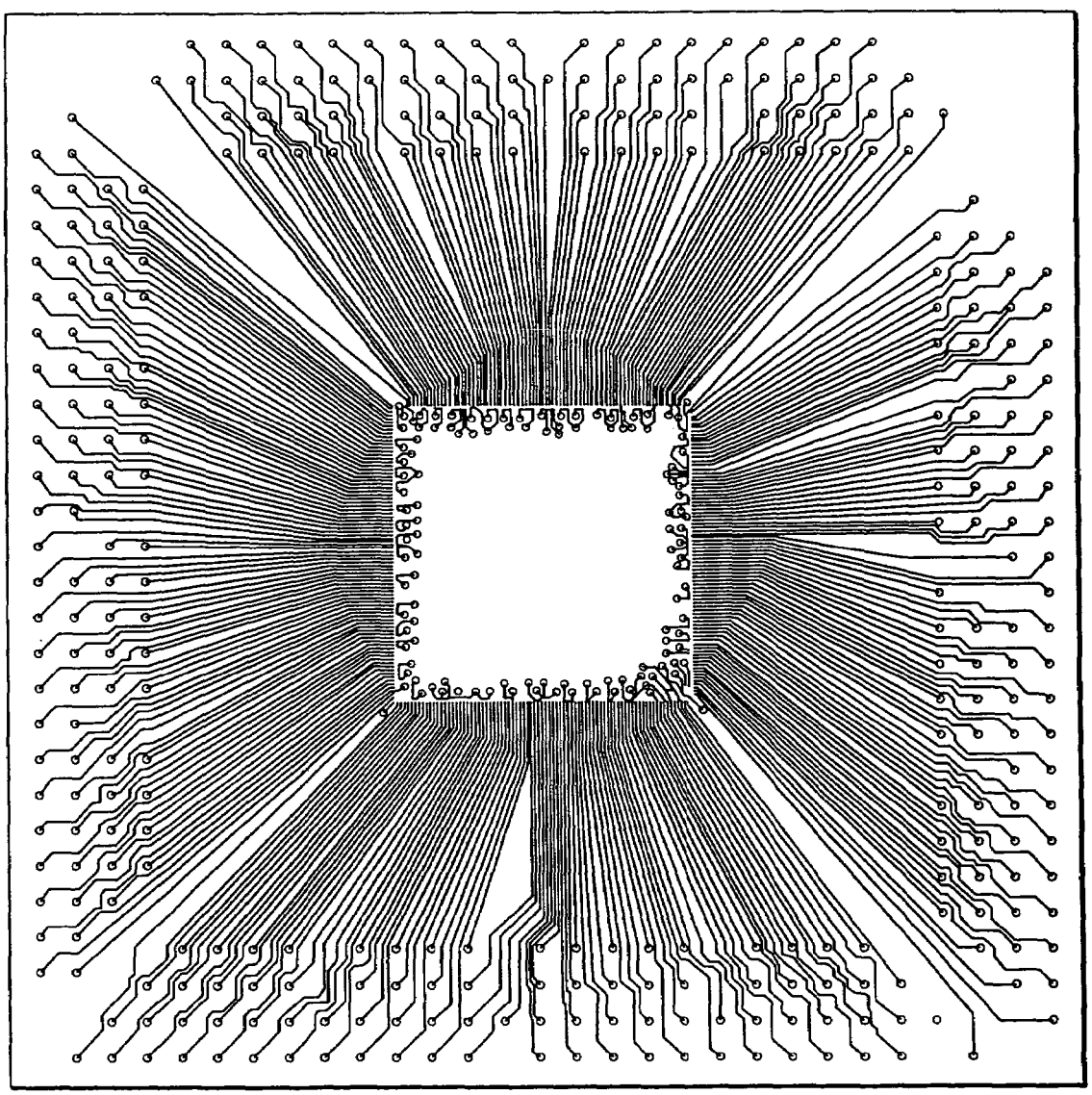
FIG. 12 is a wiring pattern view showing one embodiment of a first layer (surface) of a package substrate according to the present invention.
Figure 13:
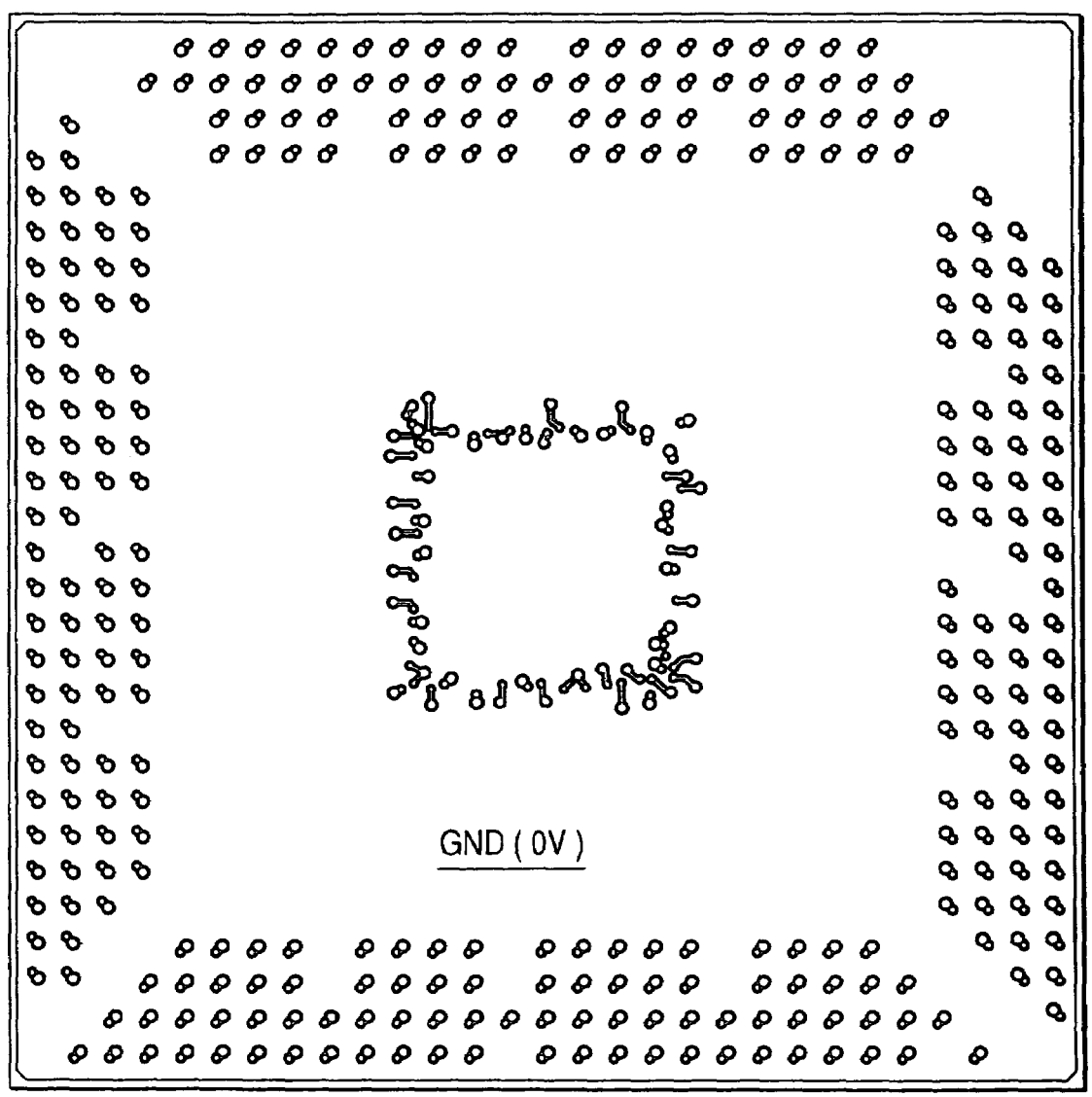
FIG. 13 is a wiring pattern view illustrating one embodiment of a second layer of the package substrate according to the present invention.
Figure 14:
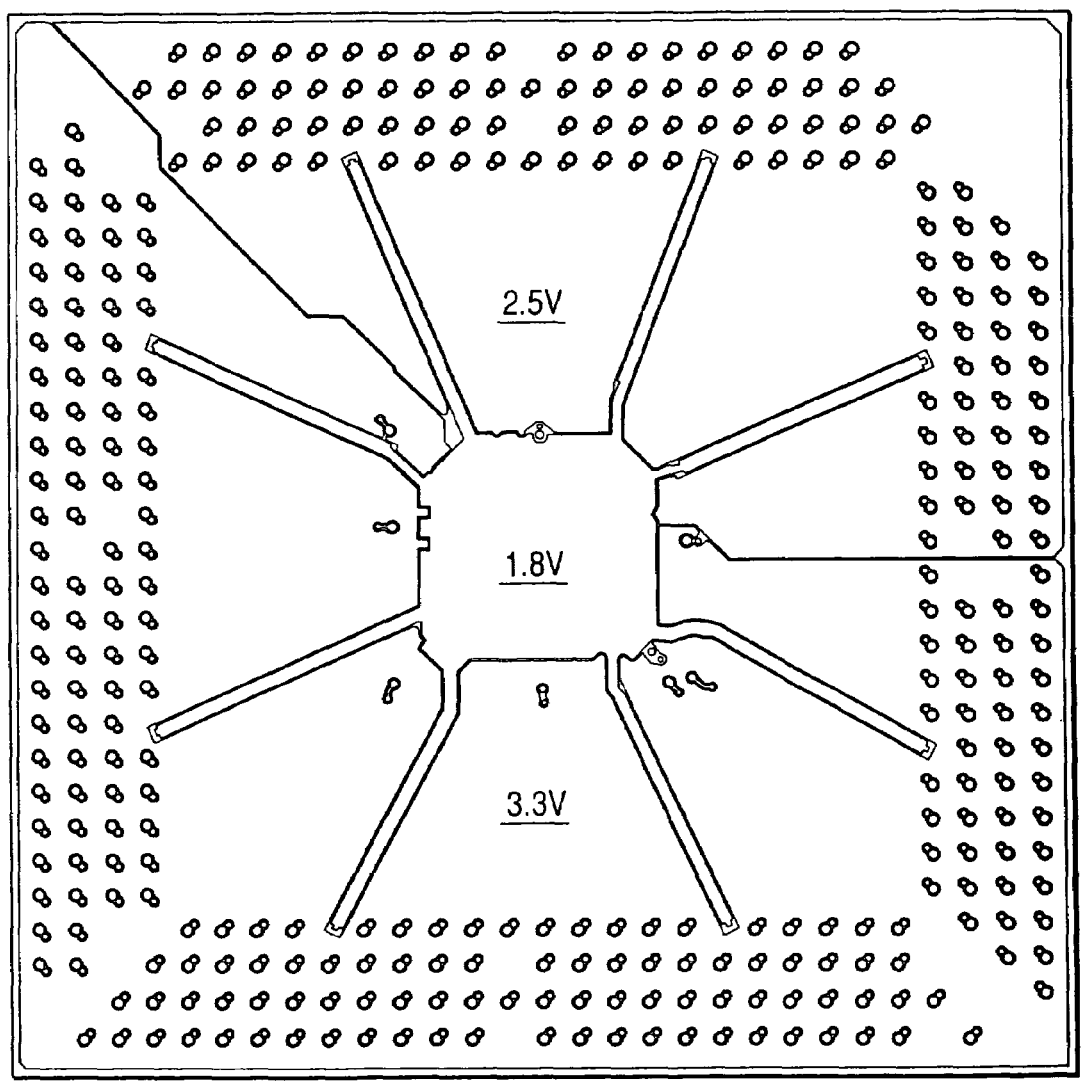
FIG. 14 is a wiring pattern view depicting one embodiment of a third layer of the package substrate according to the present invention.
Figure 15:
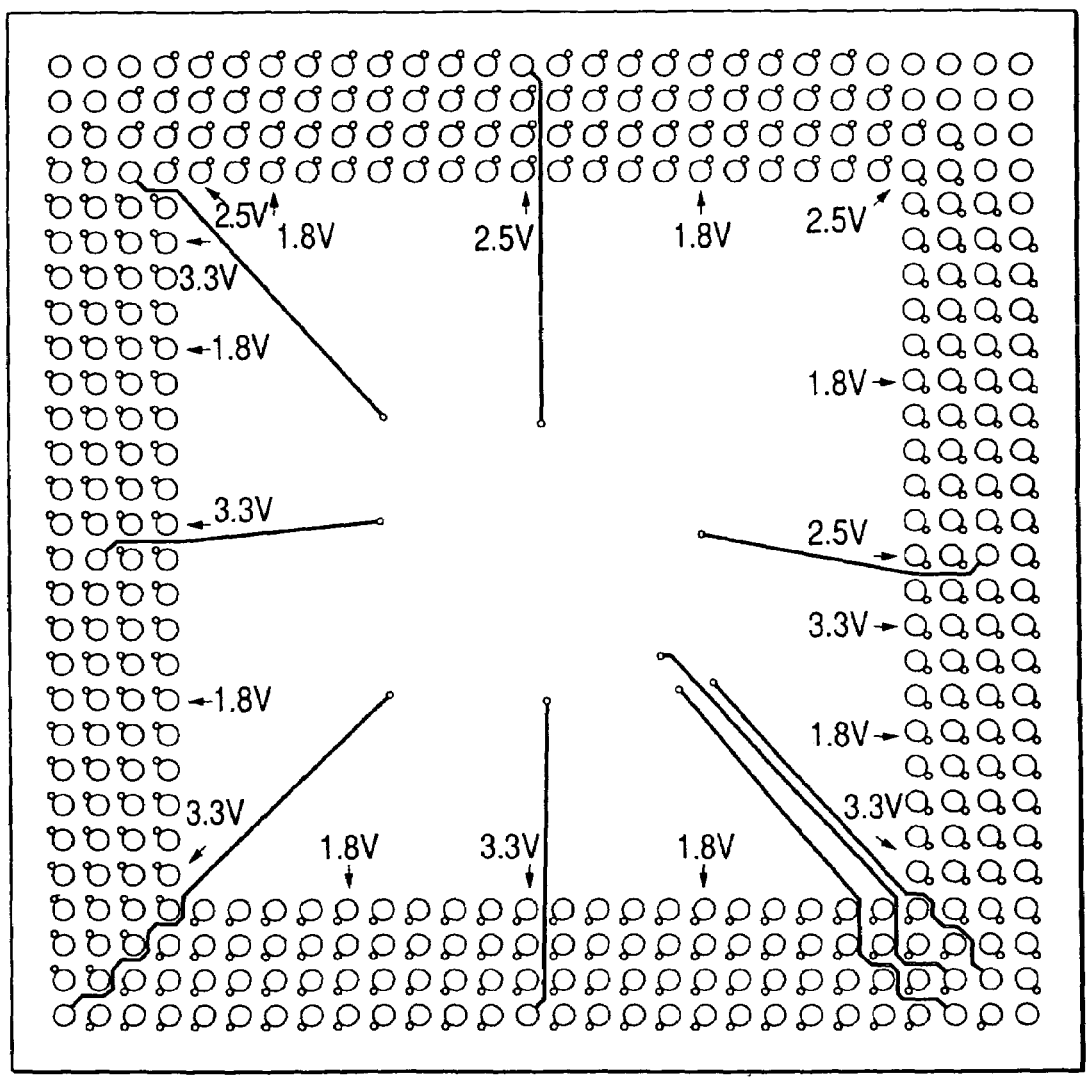
FIG. 15 is a wiring pattern view showing one embodiment of a fourth layer of the package substrate according to the present invention.

FIGS. 12 through 15 respectively show wiring pattern views illustrative of one embodiment of a package substrate according to the present invention. This embodiment corresponds to the semiconductor device shown in FIG. 1. FIG. 12 shows respective patterns corresponding to a first layer equipped with a semiconductor chip, FIG. 13 shows respective patterns corresponding to a second layer formed with a GND (ground) plane, FIG. 14 shows respective patterns corresponding to a third layer formed with power planes, and FIG. 15 shows respective patterns corresponding to a back surface (fourth layer) provided with bump electrodes, respectively.

In FIG. 12, patterns for the PKG internal signal lines 3 shown in FIG. 1 are shown, and signal lines connected to their corresponding signal terminals of the semiconductor chip extend substantially radial toward the peripheral portions of the package substrate. In FIG. 13, the whole surface is formed as the ground GND plane. Since a circuit ground potential is set to the same 0V with respect to 1.8V, 2.5V or 3.3V referred to above, it is formed by one plane. Therefore, other wiring patterns disconnected from the ground potential, like through holes or the like, are shown as patterns shown in the same drawing.

In FIG. 14, three power planes corresponding to the respective voltages 1.8V, 2.5V and 3.3V are formed to supply three power-supply voltages of 1.8V, 2.5V and 3.3V as described above. The power-supply 1.8V plane for an internal circuit is made up of a central portion corresponding to the position where the chip is placed, and wiring patterns extending in eight directions therefrom. The 2.5V power plane for an I/O circuit is provided at a right upper portion, and the 3.3V power plane for the I/O circuit is provided so as to extend from a lower half to a left upper portion.

Since the ground plane is provided over the whole surface as shown in FIG. 13, 1.8V bump electrodes provided in FIG. 15 in association with the power planes of FIG. 14 are provided 8 pairs together with ground pins. Similarly, 2.5V bump power supplies are provided 4 pairs substantially uniformly in association with the 2.5V planes, and 3.3V bump electrodes are provided 6 pairs substantially uniformly in association with the 3.3V planes. Further, some of the signal lines are provided on the back surface. Namely, the signal lines, which cannot be formed in FIG. 12, are formed through the use of the back surface.

In the present embodiment, the external terminals are provided only at an outer peripheral portion with respect to the layout of the semiconductor chip as shown in FIG. 15. Therefore, the I/O power patterns are divided by core power patterns as shown in the patterns corresponding to the third layer of FIG. 14 because it is necessary to take even core power supplies from outer peripheral pins. Further, the I/O power patterns are also divined at a rate of approximately 2:1 for 3.3V and 2.5V.

In order to supply a desired voltage to all the I/O power pins of the semiconductor chip, at least one pair of I/O power/ground pins are needed in one divided area. However, two pins or so even at minimum will be enough for them as the I/O power pins to reduce inductance from the analytical result of the present invention in consideration of the above-described division.

Figure 16A:
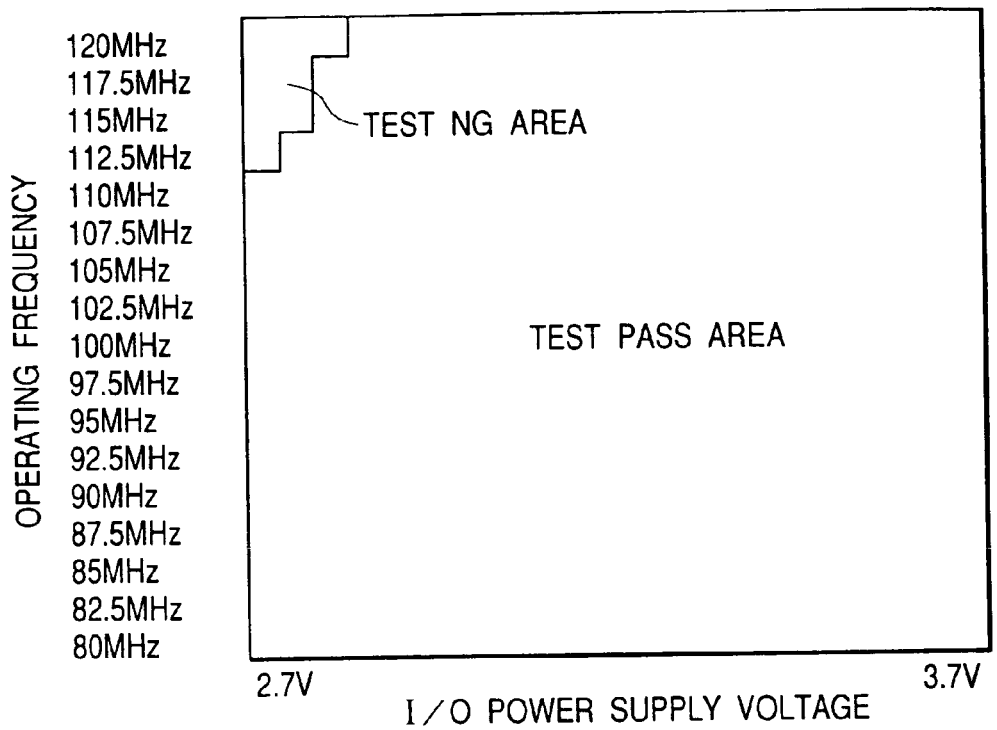
FIG. 16 is a diagram illustrating results of measurements by a semiconductor device, for describing the present invention.
Figure 16B:
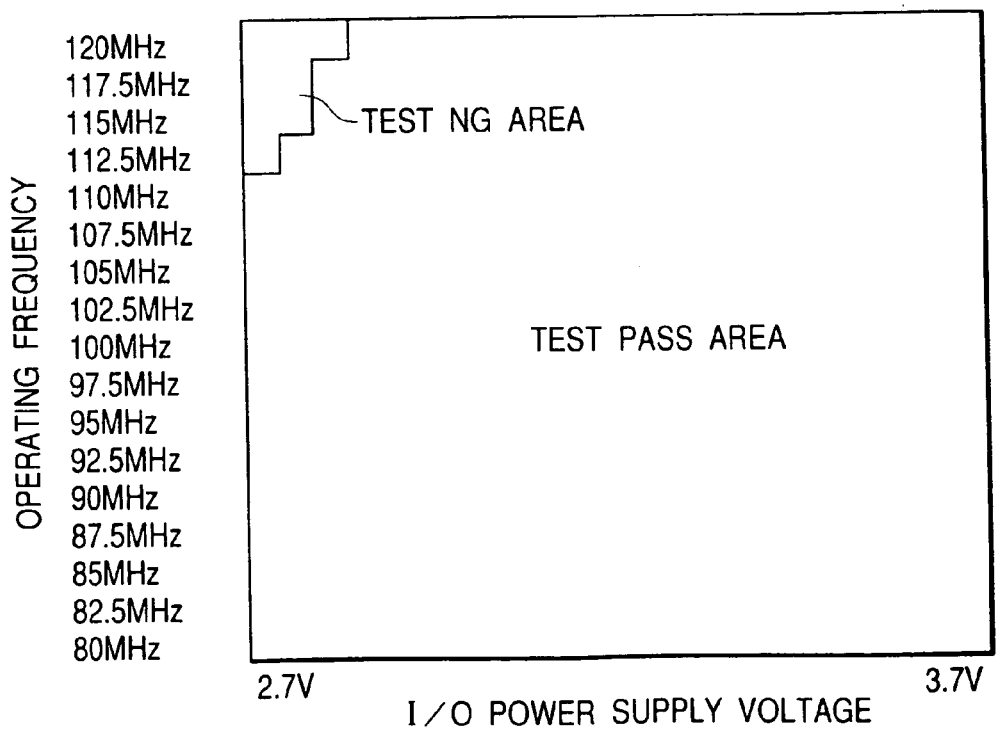

A diagram illustrating results of measurements, for describing the present invention is shown in FIG. 16. The same drawing is an example showing results of an experiment in which in order to examine the degree of each power margin for an LSI, I/O power-supply voltages and an operating frequency are changed to confirm the operation of the LSI. In the LSI, the I/O power-supply voltage is 3.3V as a Typical value.

a) indicates an initial state. This shows a case in which 31 pairs of power/ground pins are provided. b) indicates a measurement result at the time that power/ground pins of the same device are deleted up to four pairs. In the case of a), no test pattern is passed where the operation frequency changes from 110 MHz to 112.5 MHz when the I/O power-supply voltage is of 2.7V, for example. Namely, an area as viewed from the upper left of a graph indicates a test rejection, and the other area indicates a test pass.

A result obtained by deleting the I/O power pins of the device and leaving only four pairs, and performing a similar test corresponds to b). It is understood that when a) and b) are compared, there is no change in boundary line between a test pass area and a test NG area. It is understood from this point of view that no change occurs in power margin even when the number of the I/O power pins is brought to zero. It was confirmed even from the result of an actual measurement that a reduction in the number of the power pins was made possible.

Figure 17:
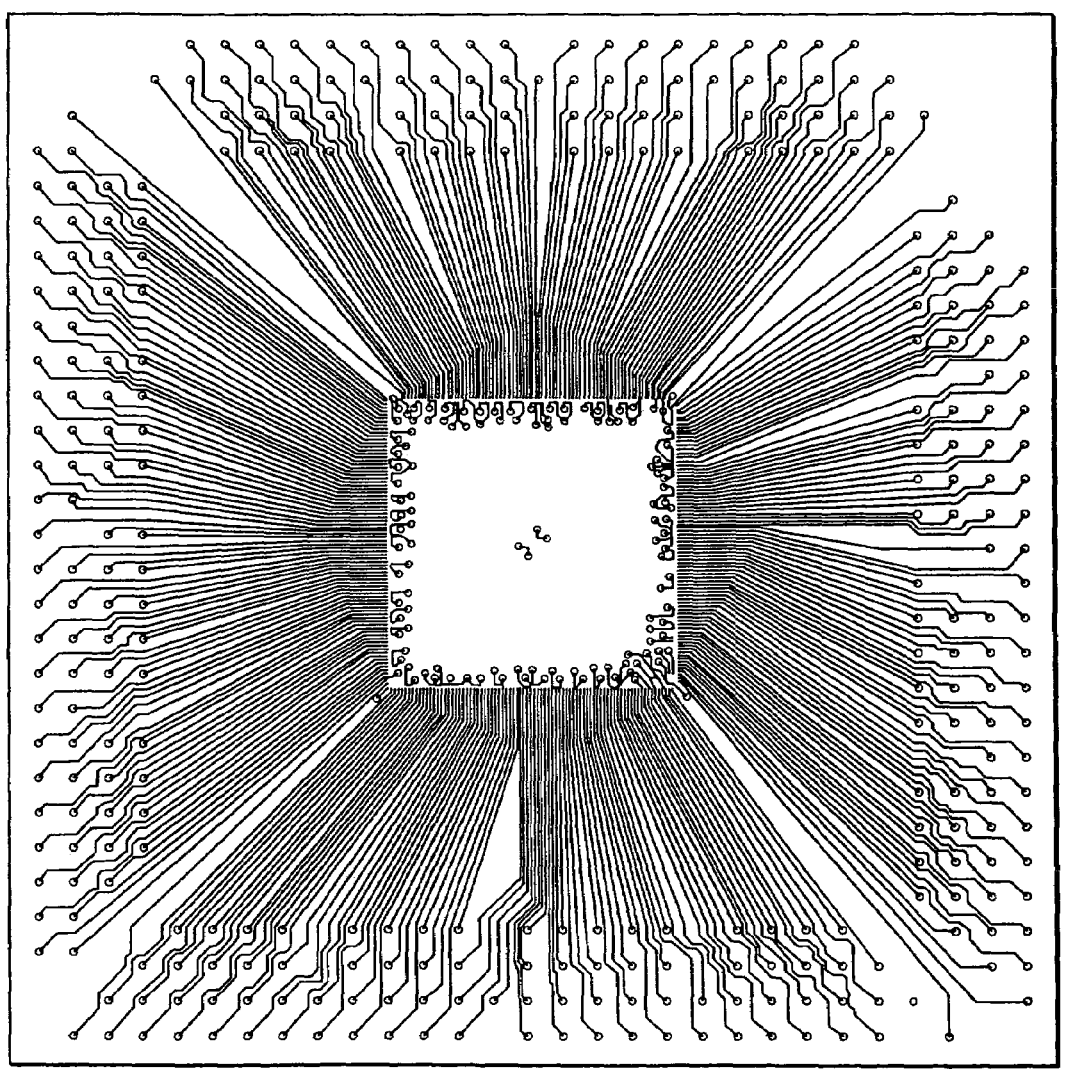
FIG. 17 is a wiring pattern view showing another embodiment of a first layer (surface) of a package substrate according to the present invention.
Figure 18:
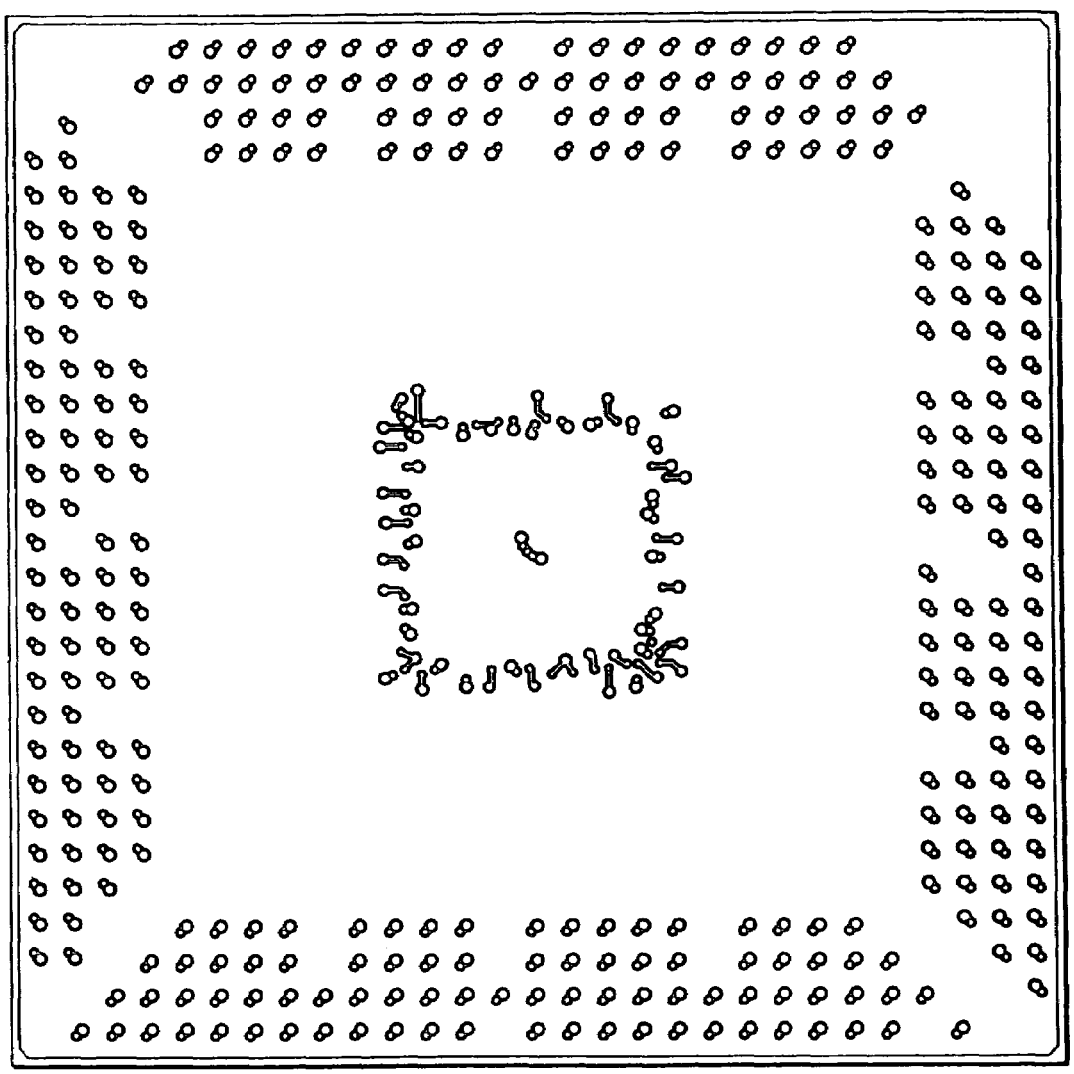
FIG. 18 is a wiring pattern view illustrating another embodiment of a second layer of the package substrate according to the present invention.
Figure 19:
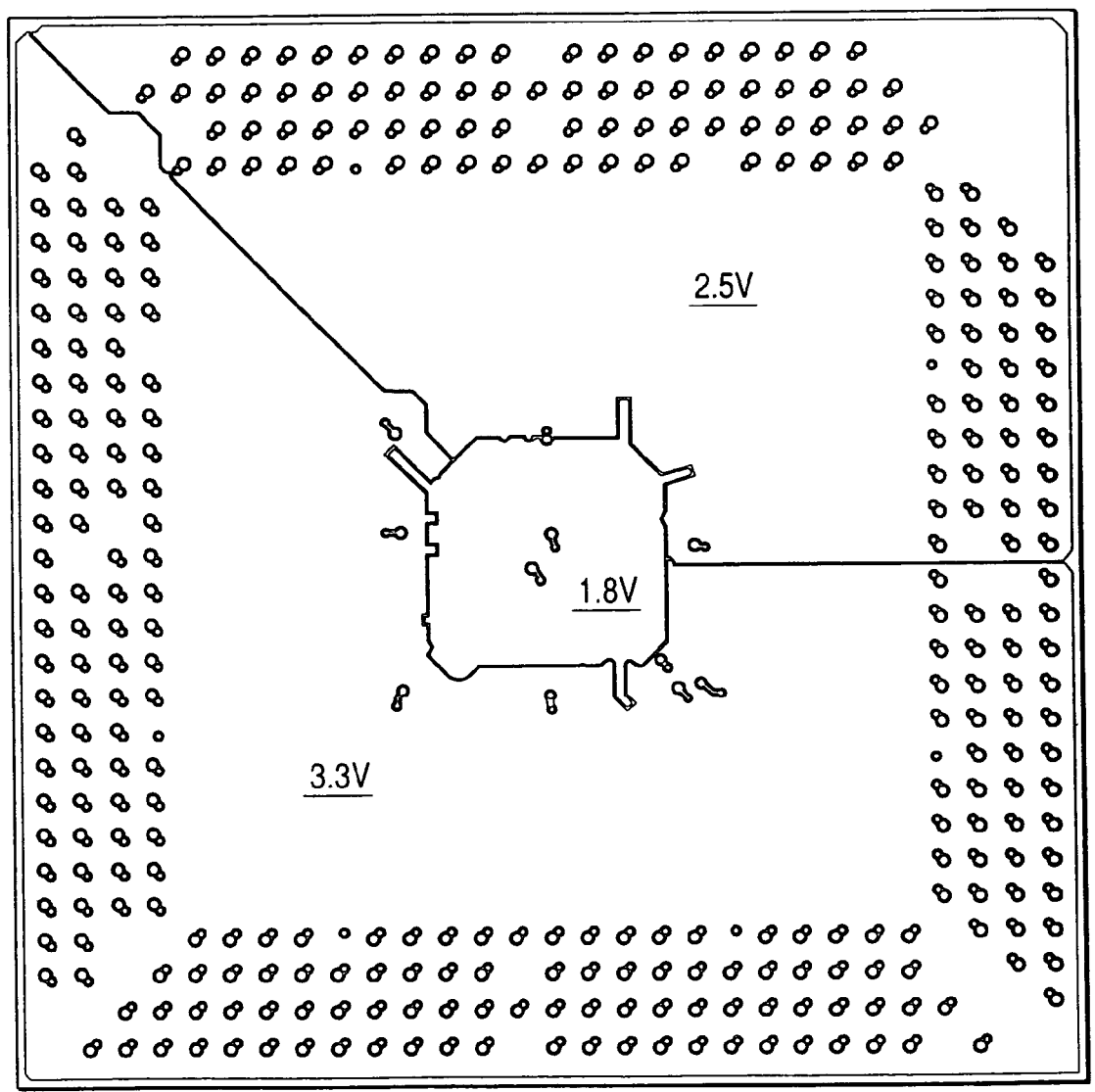
FIG. 19 is a wiring pattern view depicting another embodiment of a third layer of the package substrate according to the present invention.
Figure 20:
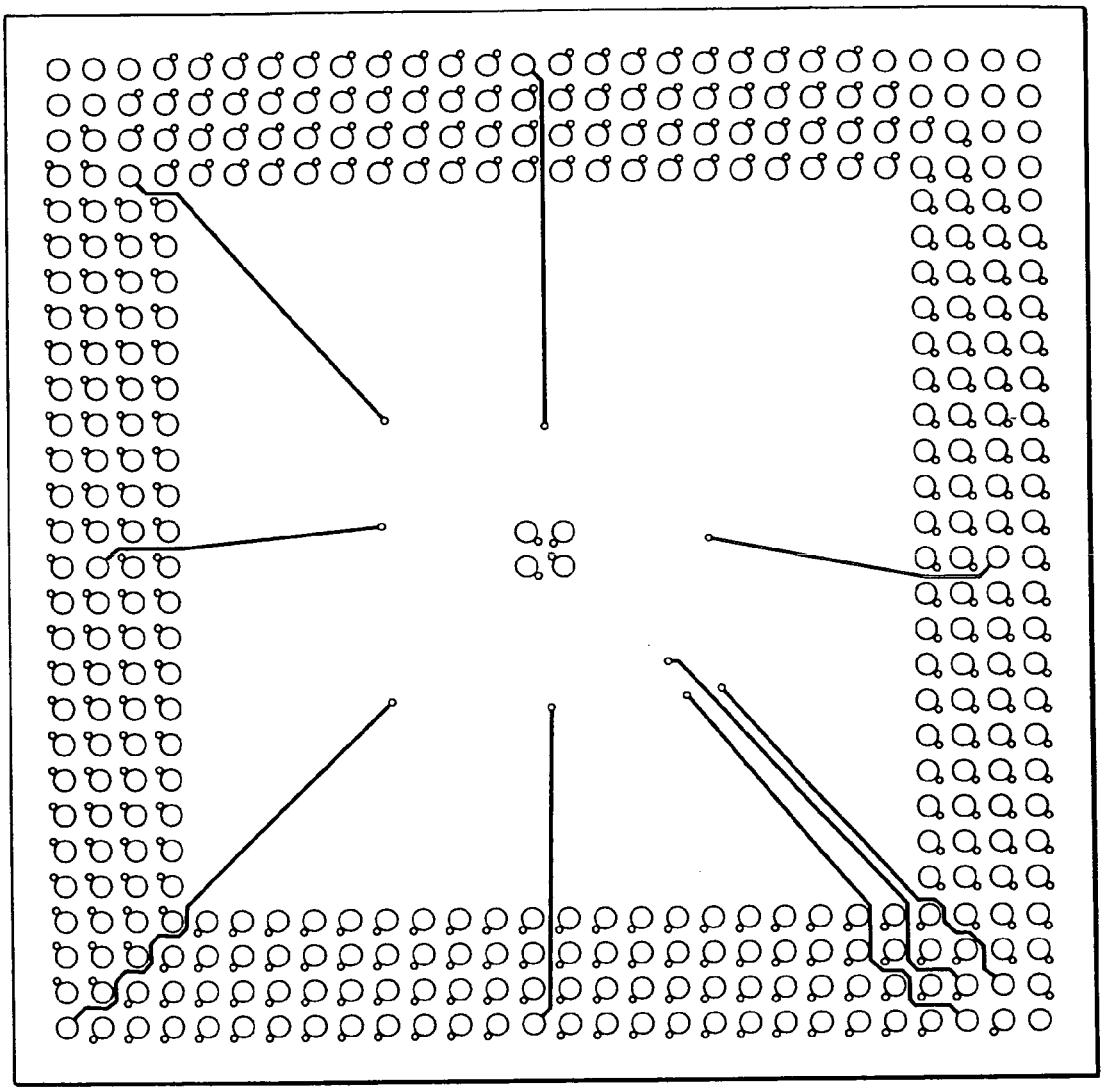
FIG. 20 is a wiring pattern view showing another embodiment of a fourth layer (back surface) of the package substrate according to the present invention.

FIGS. 17 through 20 respectively show wiring pattern views illustrative of another embodiment of a package substrate according to the present invention. This embodiment corresponds to the semiconductor device shown in FIG. 1. FIG. 17 shows respective patterns corresponding to a first layer equipped with a semiconductor chip, FIG. 18 shows respective patterns corresponding to a second layer formed with a GND (ground) plane, FIG. 19 shows respective patterns corresponding to a third layer formed with power planes, and FIG. 20 shows respective patterns corresponding to a back surface (fourth layer) provided with bump electrodes, respectively. Respective power pins at bump electrodes are similar to FIG. 15.

The present embodiment shows a case in which center pins are additionally provided at a central portion of a package back surface. In the present embodiment, a core power pin and a ground pin pairing up with the power pin are provided as the center pins. Therefore, a core power supply (1.8V) can be supplied from the corresponding center pins. It is thus not necessary to divide I/O power planes corresponding to a third layer in FIG. 19 by core power patterns. It is desirable that the center pins comprises only the core power pin and the ground pin pairing up with the same.

Figure 21:
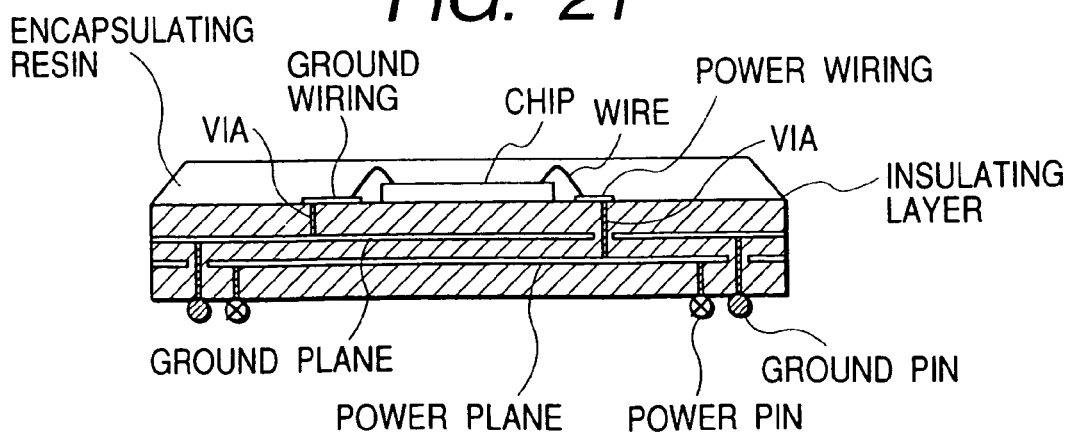
FIG. 21 is a schematic cross-sectional view illustrating another embodiment of a semiconductor device having a BGA structure, according to the present invention.

A schematic cross-sectional view of another embodiment of a semiconductor device having a BGA structure, according to the present invention is shown in FIG. 21. A semiconductor chip is mounted on the one main surface side of a package substrate, and external terminals of the semiconductor device are disposed on the other main surface (back surface) side of the package substrate. Electrodes of the semiconductor chip and electrodes of a substrate package are connected to one another by bonding wires. Namely, the present embodiment is intended for a BGA package of a wiring bonding type. Since the package substrate side is similar to the embodiment of FIG. 2 except for portions where the bonding wires are provided, its description is omitted.

Figure 22:
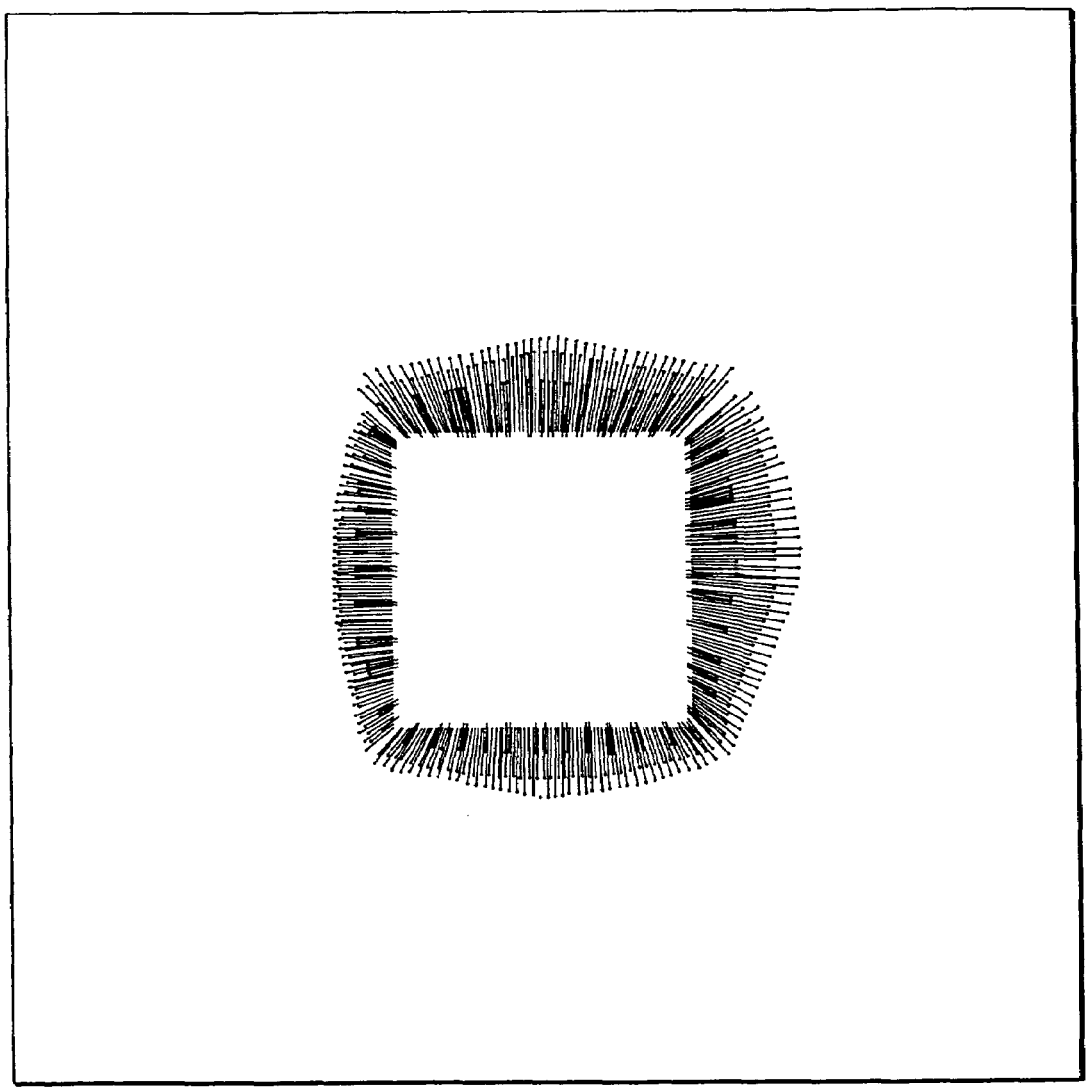
FIG. 22 is a pattern view showing one embodiment illustrative of bonding wires shown in FIG. 21.

A pattern view of one embodiment illustrative of bonding wires is shown in FIG. 22. Electrodes of a semiconductor chip and electrodes of a package substrate are connected to one another by bonding wires through the use of such patterns as shown in the same drawing.

Figure 23:
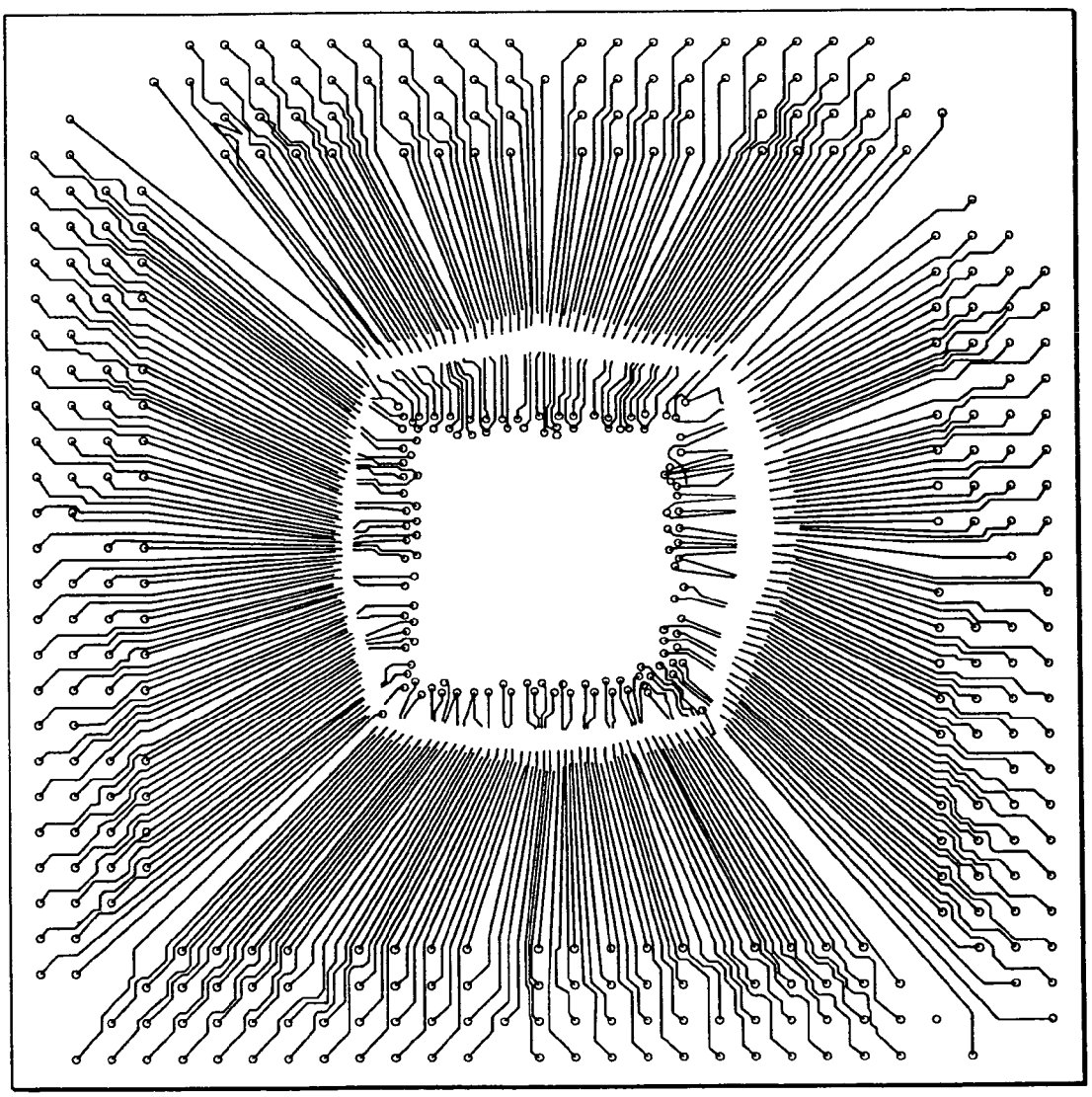
FIG. 23 is a wiring pattern view depicting one embodiment of a first layer (surface) of a package substrate corresponding to the embodiment shown in FIG. 22.
Figure 24:
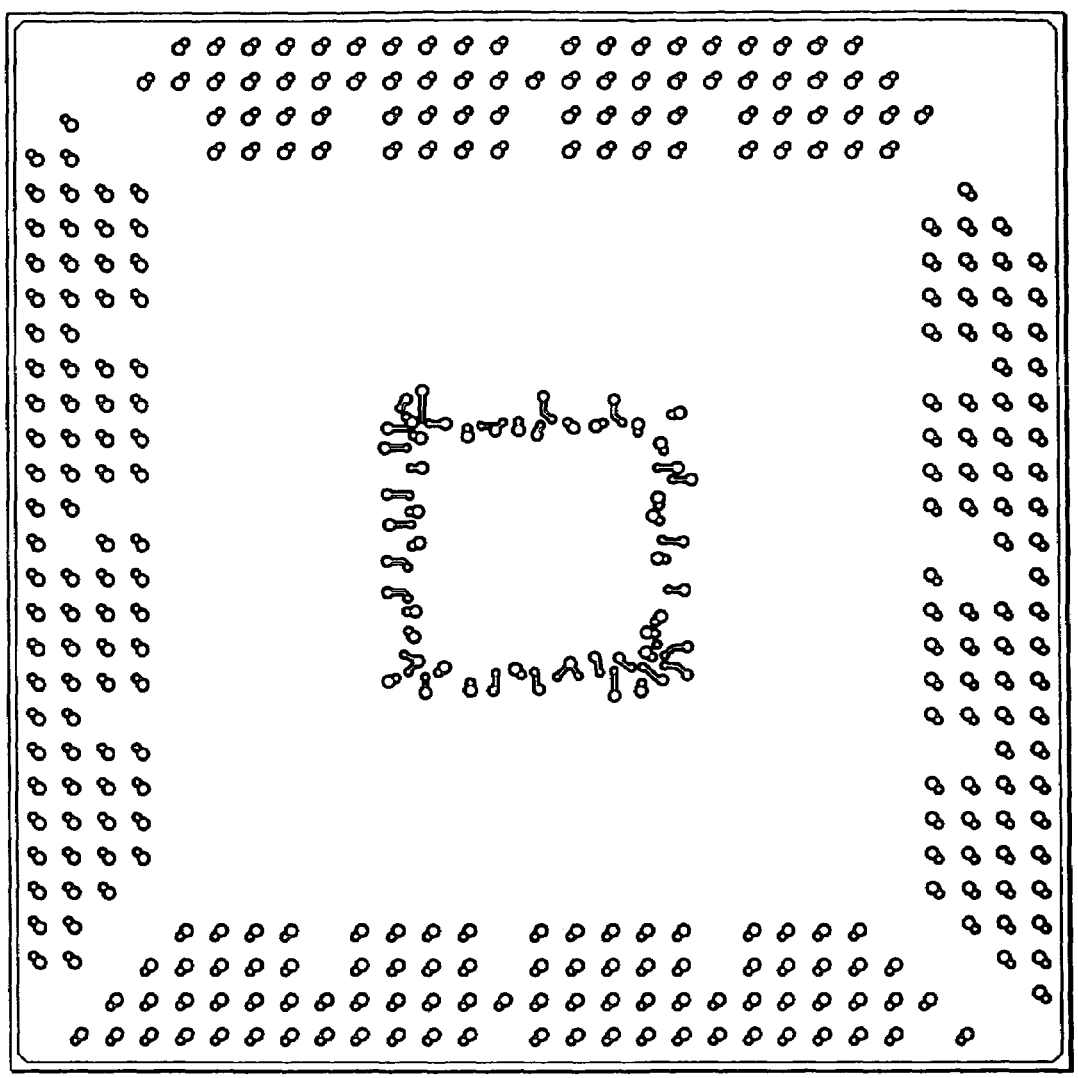
FIG. 24 is a wiring pattern view showing one embodiment of a second layer of the package substrate corresponding to the embodiment shown in FIG. 22.
Figure 25:
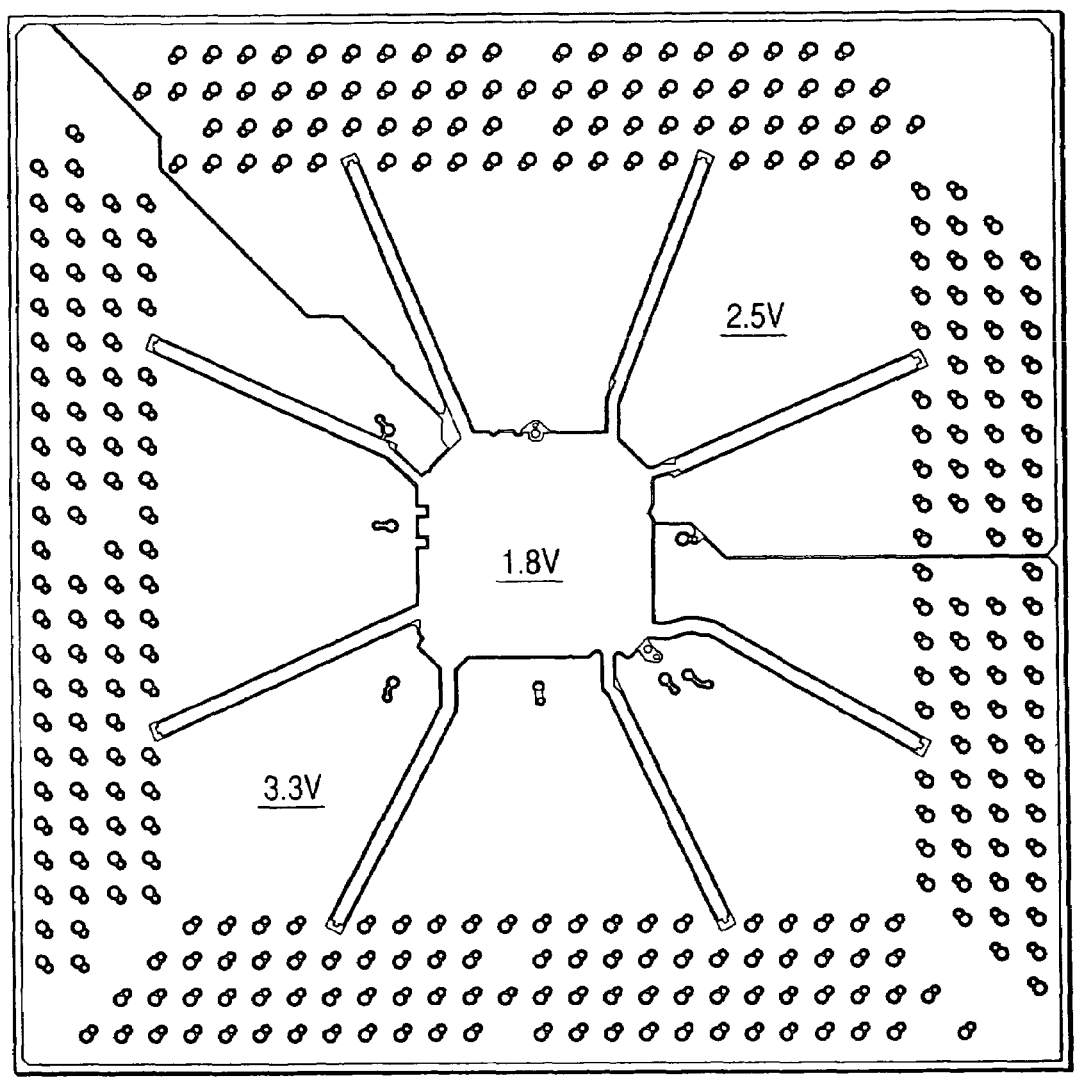
FIG. 25 is a wiring pattern view illustrating one embodiment of a third layer of the package substrate corresponding to the embodiment shown in FIG. 22.
Figure 26:
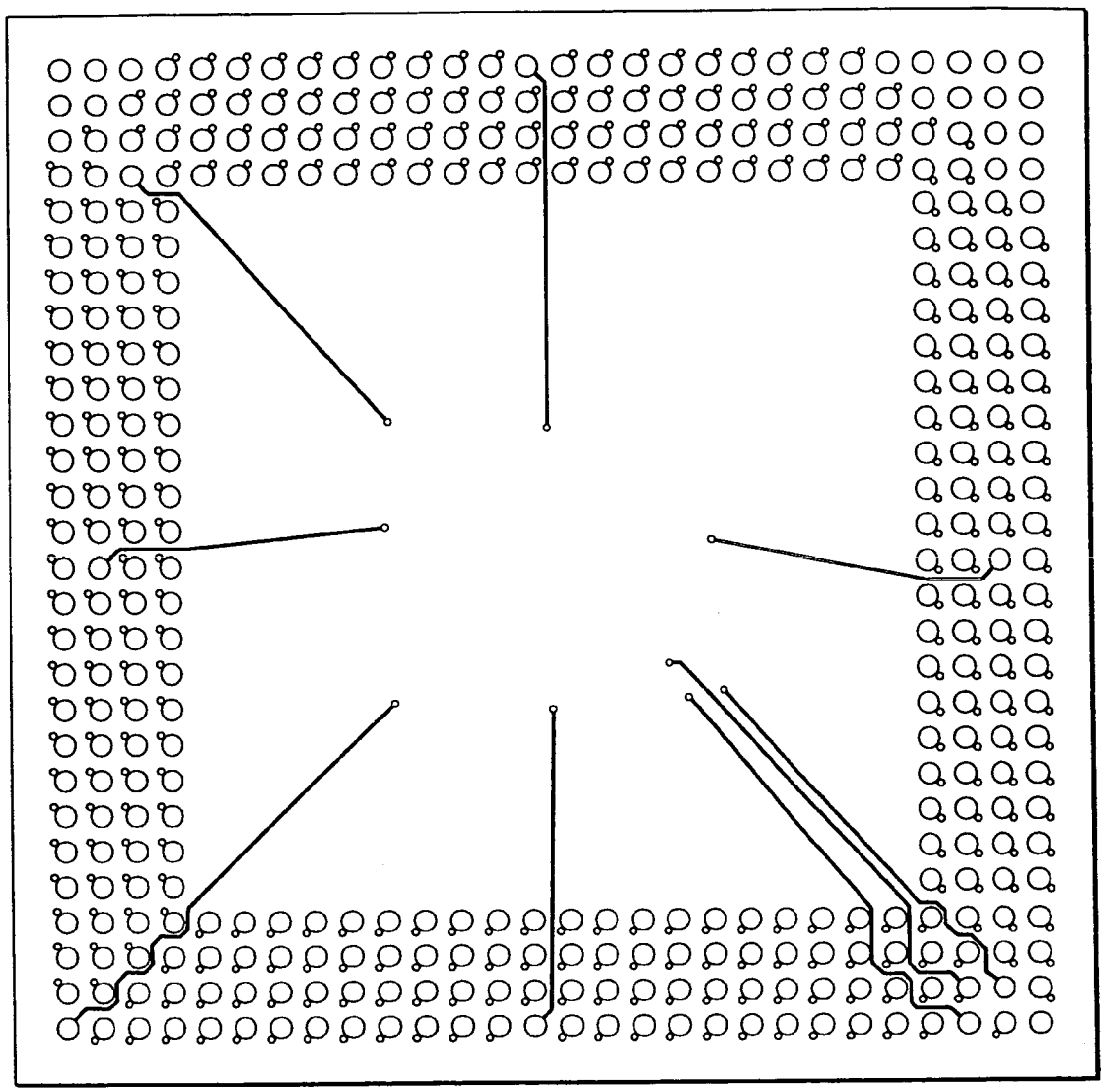
FIG. 26 is a wiring pattern view depicting one embodiment of a fourth layer of the package substrate corresponding to the embodiment shown in FIG. 22.

FIGS. 23 through 26 respectively show wiring pattern views of one embodiment of a package substrate corresponding to the embodiment of FIG. 22. FIG. 23 shows respective patterns corresponding to a first layer equipped with a semiconductor chip, FIG. 24 shows respective patterns corresponding to a second layer formed with a GND (ground) plane, FIG. 25 shows respective patterns corresponding to a third layer formed with power planes, and FIG. 26 shows respective patterns corresponding to a back surface (fourth layer) provided with bump electrodes, respectively. Respective power pins at bump electrodes are similar to FIG. 15.

The number of pads on the semiconductor chip according to the present embodiment, and the number of pins on the BGA side are respectively identical to the embodiment shown in the above drawings. It is understood from the present embodiment that it is applicable even to an LSI of a wiring bonding type.

Figure 27:
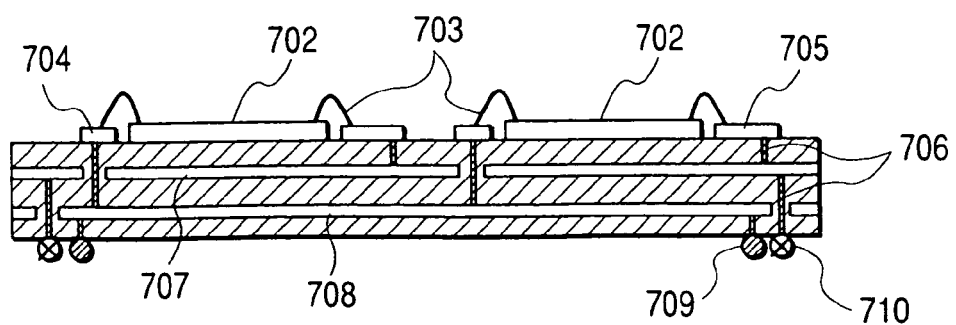
FIG. 27 is a schematic cross-sectional view illustrating a further embodiment of a semiconductor device having a BGA structure, according to the present invention.

A schematic cross-sectional view of a further embodiment of a semiconductor device having a BGA structure, according to the present invention is shown in FIG. 27. The semiconductor device according to the present embodiment is intended for a multi chip module. The multichip module is one wherein a plurality of semiconductor chips each brought to such a significantly downsized form as referred to as a bare chip are formed as a semiconductor device provided in one package form.

Although not restricted in particular, two semiconductor chips 702 are mounted on one main surface side of a package substrate. External terminals (bump electrodes) 709 and 701 of a semiconductor device 701 are disposed on the other main surface (back surface) side of the package substrate. Electrodes of the semiconductor chip 702 and electrodes 704 of a substrate package are respectively connected by bonding wires 703. Namely, the present embodiment is configured by a BGA package of a wiring bonding type.

Figure 28:
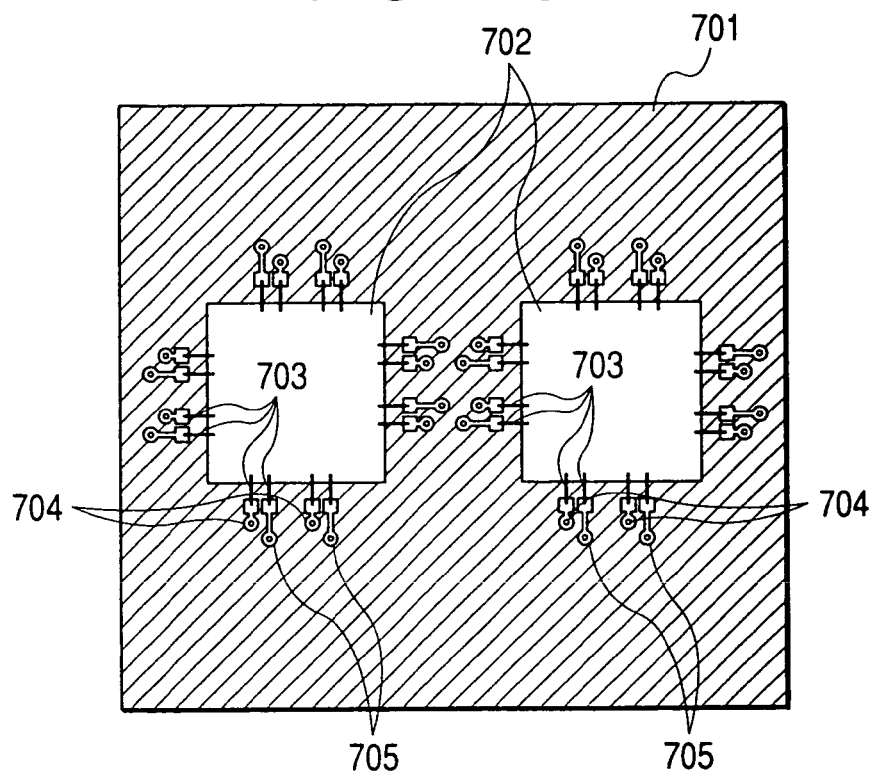
FIG. 28 is a top plan view showing one embodiment of the semiconductor device shown in FIG. 27.
Figure 29:
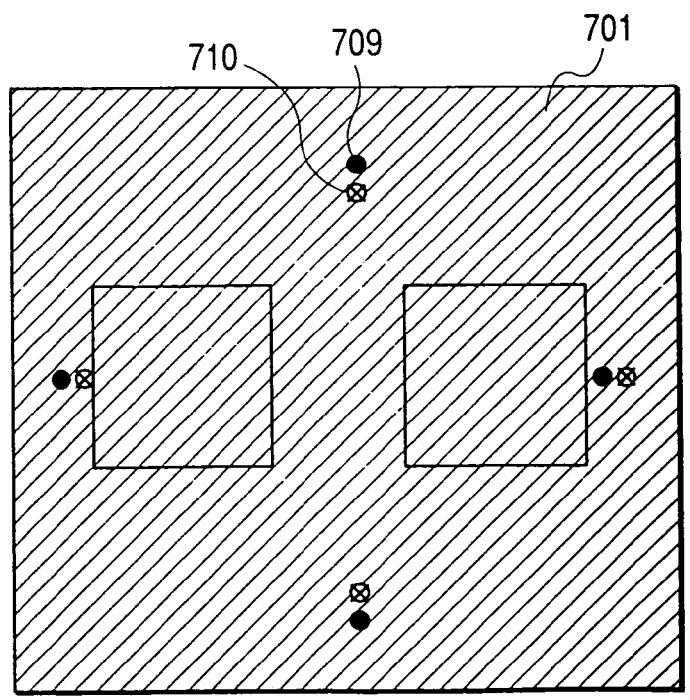
FIG. 29 is a back side view depicting one embodiment of the semiconductor device shown in FIG. 27.

A top plan view of one embodiment of the semiconductor device shown in FIG. 27 is illustrated in FIG. 28. A back side view of one embodiment of the semiconductor device shown in FIG. 27 is shown in FIG. 29. A power system for supplying an operating voltages to each output circuit (I/O circuit) is illustratively shown in FIGS. 28 and 29 as a typical one.

As shown in FIG. 28, power/ground pins in the respective semiconductor chips 702 are provided 8 pairs in total at four sides by two pairs owing to the provision of the two semiconductor chips 702, respectively, whereas power/ground pins for external terminals are integrated into four pairs as shown in FIG. 29. The output circuit is set to one kind of power-supply voltage like 3.3V or 2.5V in the present embodiment, whereas when the two types are prepared as in the above-described embodiment, the number of the power-supply voltages is increased correspondingly. However, they are integrated so as to be smaller in number than power supply electrodes provided for the semiconductor chips 702. Even in the case of less than or equal to one-half the number of power/ground pins of a chip having the maximum number of power/ground pairs, a noise reduction effect according to the present invention is obtained as in the present embodiment.

Figure 30:
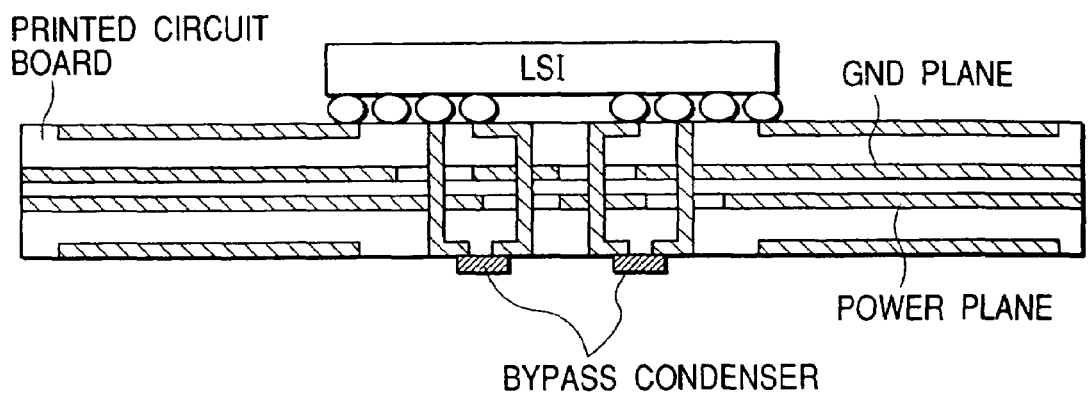
FIG. 30 is a schematic cross-sectional view illustrating one embodiment where the present invention is applied to a printed circuit board constituting an electronic device.

A schematic cross-sectional view of one embodiment at the time that the semiconductor device obtained by the present invention is mounted to a printed circuit board, is shown in FIG. 30. The LSI of the BGA package is mounted on the surface of the printed circuit board and connected to wirings formed on the printed circuit board. Of these, GND and power planes are provided inside as power supply paths in a manner similar to the package substrate and connected to their corresponding power pins of the LSI. In the present embodiment, power terminals intensively placed on the back surface side of the printed circuit board are provided with the GND and power planes being interposed therein, and connected with bypass condensers for power stabilization.

Figure 31:
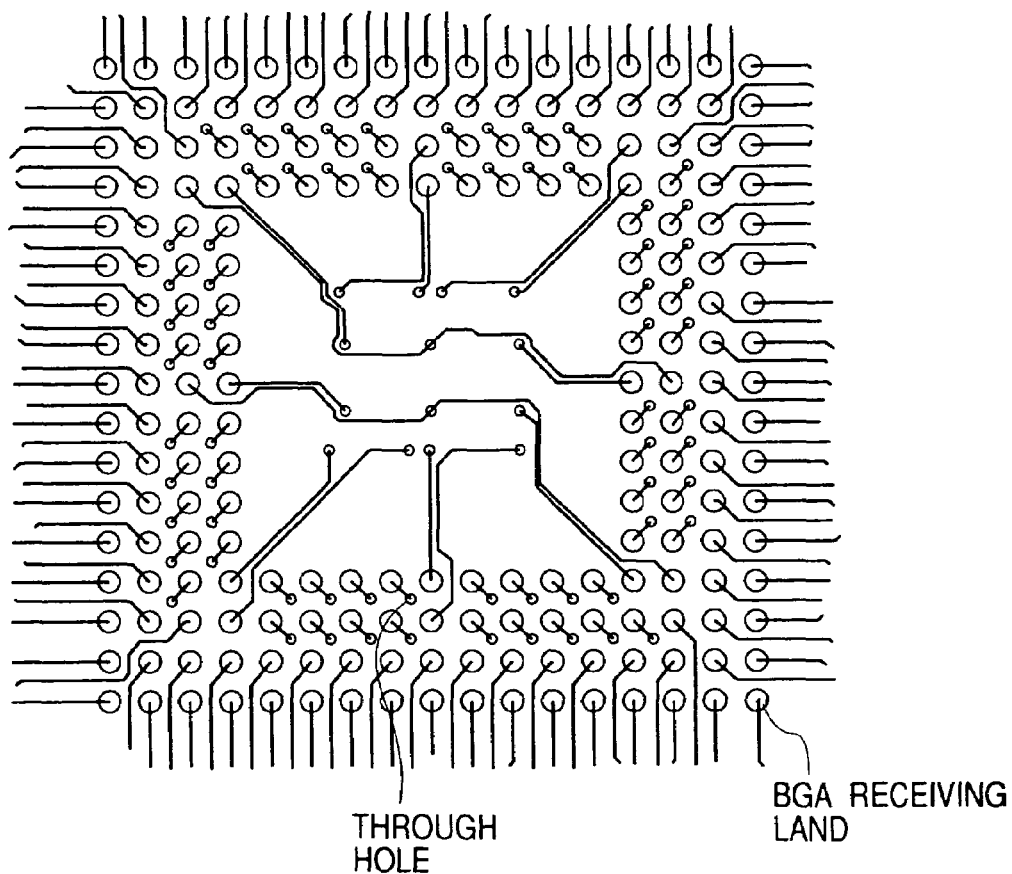
FIG. 31 is a pattern view showing one embodiment of a surface portion of the printed circuit board shown in FIG. 30.

A pattern view of one embodiment illustrative of a surface portion of the printed circuit board is shown in FIG. 31. In the same drawing, electrodes indicated by ○ correspond to connecting ends (BGA receiving lands) respectively connected to the bump electrodes. Further, wirings that constitute signal lines and power lines, extend from the connecting ends.

Figure 32:
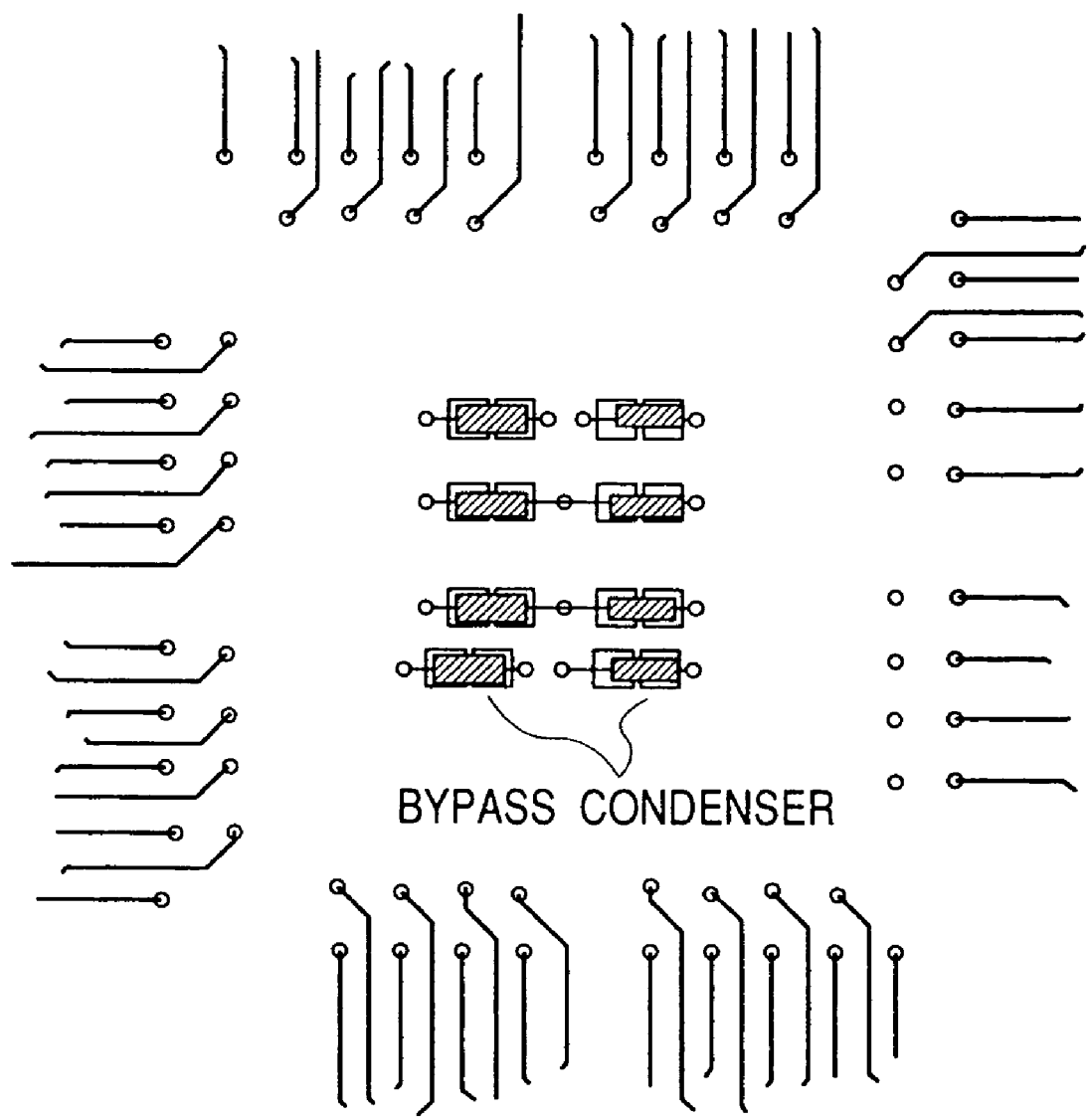
FIG. 32 is a pattern view depicting one embodiment of a back surface of the printed circuit board shown in FIG. 30.

A pattern view of one embodiment of a back surface portion of a printed circuit board is shown in FIG. 32. When power/ground pairs are intensively set to a less number on the back surface side of the printed circuit board as in this embodiment, one bypass condenser can be placed with respect to the power/ground pair corresponding to one pair. Therefore, the less number of bypass condensers identical to the number of the power/ground pairs can be packaged or mounted.

Operations and advantageous effects obtained from the above-described embodiments are as follows:

(1) An advantageous effect is obtained in that a package substrate is provided which is equipped, on its surface, with a semiconductor chip having a plurality of output circuits each outputting a signal formed by an internal circuit, a first voltage supply electrode which supplies an operating voltage to the internal circuit, and a plurality of second voltage supply electrodes which supply operating voltages to the plurality of output circuits, and which is provided on its back surface, external terminals and has a plurality of wiring layers, and a first electrode having one end connected to the first voltage supply electrode of the semiconductor chip, a plurality of second electrodes having one ends respectively connected to the plurality of second voltage supply electrodes, first wiring means which includes a wiring layer different from the surface wiring layers and commonly connects the second electrodes respectively, second wiring means which connects the first electrode and a corresponding one of the external terminals provided on the back surface, and a plurality of third wiring means which respectively connect the first wiring means and a plurality of external terminals equivalent to a number aggregated to a number fewer than the second electrodes provided on the back surface are provided on the surface of the package substrate, thereby making it possible to obtain a semiconductor device which reduces the number of external power terminals or realizes its scale down while suppressing power noise.

(2) In addition to the above, an advantageous effect is obtained in that the package substrate is provided with fourth wiring means which includes a wiring layer different from a wiring layer formed with each of the first and second electrodes and commonly supplies a circuit ground potential to an internal circuit and a plurality of output circuits of the semiconductor chip, and a plurality of external terminals connected via the fourth wiring means, thereby making it possible to dispose ground terminals pairing up with the power terminals with a simple structure.

(3) In addition to the above, an advantageous effect is obtained in that the number aggregated to the number fewer than the second electrodes is set to 4 or more, and these 4 or more external terminals are dispersively laid out in areas obtained by dividing an area formed with external terminals on the back surface into quarters, thereby making it possible to effectively reduce the number of the external terminals while reducing power noise.

(4) In addition to the above, an advantageous effect is obtained in that the first wiring means which commonly connects the second electrodes respectively, is electrically isolated and divided into two or more sets and makes it possible to supply different operating voltages from external terminals to their corresponding sets, thereby making it possible to obtain a semiconductor device intended for a flexible system configuration.

(5) In addition to the above, an advantageous effect is obtained in that the semiconductor chip and the corresponding electrodes on the package substrate are connected to one another in a flip-flop configuration, whereby a reduction in size is enabled.

(6) In addition to the above, an advantageous effect is obtained in that the semiconductor chip and the corresponding electrodes on the package substrate are connected to one another in a wire-bonding configuration, whereby assembling can be simply performed.

(7) In addition to the above, an advantageous effect is obtained in that external terminals for supplying operating voltages to the internal circuit are provided inside a back surface corresponding to a position where the semiconductor chip is mounted, and external terminals for supplying operating voltages to the output circuits and external terminals for the input or output of signals are provided outside the back surface corresponding to the position where the semiconductor chip is mounted, thereby making it possible to avoid the separation of power planes for each output circuit and reduce an effective inductance.

(8) In addition to the above, an advantageous effect is obtained in that the semiconductor device is provided two or more, thereby making it possible to bring a high-performance semiconductor device or system into less size.

(9) An advantageous effect is obtained in that a printed circuit board is provided which is equipped, on its surface, with a semiconductor device having a plurality of power terminals which supply operating voltages, and a plurality of ground terminals each of which supplies a circuit ground potential, and which is provided with a bypass condenser on its back surface, and a plurality of first electrodes having one ends respectively connected to the plurality of power terminals of the semiconductor device, a plurality of second electrodes having one ends respectively connected to the plurality of ground terminals of the semiconductor device, first wiring means which includes a wiring layer different from a wiring layer formed with the first electrodes and commonly connects the first electrodes, second wiring means which commonly connects the second electrodes, third wiring means which connects the first wiring means and third electrodes equivalent to a number aggregated to a number fewer than the first electrodes provided on the back surface, fourth wiring means which connects fourth electrodes equivalent to a number aggregated to a number fewer than the second electrodes, and a bypass condenser provided between each of the third electrodes and each of the fourth electrode are provided on the surface of the printed circuit board, thereby making it possible to efficiently mount a bypass condenser.

While the invention made above by the present inventors has been described specifically by the illustrated embodiments, the invention of the present application is not limited to the embodiments. It is needless to say that various changes can be made thereto within the scope not departing from the substance thereof. Since the core voltage 1.8V causes only the dc current to flow substantially as described above in FIG. 14, for example, the number of terminals may be reduced up to two or so if preference is given over a reduction in the number of the terminals. The I/O power supply may be set to one type or increased to three or more types. A material, which constitutes the package substrate, may adopt various embodied forms. A semiconductor device having a multi-chip configuration may be one having such a structure that a first semiconductor chip is placed on a package substrate and a second semiconductor chip is placed thereon. The semiconductor device is applicable even to a cavity down-type BGA package wherein external terminals and a chip surface are placed in the same direction. The present invention can be widely used as a semiconductor device and an electronic device.

An advantageous effect obtained by a typical one of the inventions disclosed in the present application will be described in brief as follows: A package substrate is provided which is equipped, on its surface, with a semiconductor chip having a plurality of output circuits each outputting a signal formed by an internal circuit, a first voltage supply electrode which supplies an operating voltage to the internal circuit, and a plurality of second voltage supply electrodes which supply operating voltages to the plurality of output circuits, and which is provided on its back surface, external terminals and has a plurality of wiring layers, and a first electrode having one end connected to the first voltage supply electrode of the semiconductor chip, a plurality of second electrodes having one ends respectively connected to the plurality of second voltage supply electrodes, first wiring means which includes a wiring layer different from the surface wiring layers and commonly connects the second electrodes respectively, second wiring means which connects the first electrode and a corresponding one of the external terminals provided on the back surface, and a plurality of third wiring means which respectively connect the first wiring means and a plurality of external terminals equivalent to a number aggregated to a number fewer than the second electrodes provided on the back surface are provided on the surface of the package substrate, thereby making it possible to obtain a semiconductor device which reduces the number of external power terminals or realizes its scale down while suppressing power noise.

The invention claimed is:

1. A semiconductor device comprising:
a package substrate having a multilayer structure;
a semiconductor chip mounted on a main surface of said package substrate;
wherein said semiconductor chip includes,
an internal circuit;
an I/O circuit interacting a signal between said internal circuit and an external device;
a first voltage supply electrode which supplies a first operating voltage to said internal circuit; and
a second voltage supply electrode which supplies a second operating voltage, being different from said first operating voltage, to said I/O circuit, and
wherein said package substrate includes,
a first electrode provided on said main surface of said package substrate and being electrically coupled to said first voltage supply electrode of said semiconductor chip;
a second electrode provided on said main surface of said package substrate and being electrically coupled to said second voltage supply electrode of semiconductor chip;
a first wiring plane being formed of a wiring layer which is different from said first and second electrodes and being electrically coupled to said first electrode via a through hole;
a second wiring plane being formed of the same wiring layer as that of said first wiring plane and being electrically coupled to said second electrode via a through hole;
a third wiring plane being formed of a wiring layer which is different from both said first and second wiring planes and each of said first and second electrodes, said third wiring plane commonly supplying a reference potential to said internal circuit and said I/O circuit of said semiconductor chip:
third electrodes provided on said back surface opposing to said main surface of said package substrate; and
said third electrodes being used as external terminals of said package substrate,
wherein said first wiring plane and said second wiring plane are separated from each other in a plane view.

2. The semiconductor device according to claim 1,
wherein said semiconductor chip includes a plurality of I/O circuits each of which outputs a signal formed by said internal circuits,
said plurality of second voltage supply electrodes which supplies different operating voltages each other to said plurality of I/O circuits.

3. The semiconductor device according to claim 1, wherein said second wiring plane having a plurality of wiring layers which are separated from each other in a plane view.

4. The semiconductor device according to claim 1, wherein said package substrate is provided with a plurality of external terminals which connected via a fourth wiring plane being formed of a wiring layer which is different from said first, second and third wiring plane and each of said first and second electrodes.

5. The semiconductor device according to claim 1,
wherein the number aggregated to the number less than said second electrodes is 4 or more, and
wherein these 4 or more external terminals are dispersively laid out in areas obtained by dividing an area formed with external terminals on the back surface into quarters.

6. The semiconductor device according to claim 5, wherein said first wiring plane which commonly coupled said second electrodes respectively, is electrically isolated and divided into two or more sets and makes it possible to supply different operating voltages from external terminals to their corresponding sets.

7. The semiconductor device according to claim 6, wherein said semiconductor chip and the corresponding electrodes on said package substrate are coupled to one another in a flip-flop configuration.

8. The semiconductor device according to claim 6, wherein said semiconductor chip and the corresponding electrodes on said package substrate are coupled to one another in a wire-bonding configuration.

9. The semiconductor device according to claim 1,
wherein external terminals for supplying operating voltages to said internal circuit are provided inside a back surface corresponding to a position where said semiconductor chip is mounted, and
wherein external terminals for supplying operating voltages to said I/O circuits and external terminals for the input or output of signals are provided outside the back surface corresponding to the position where said semiconductor chip is mounted.

10. A semiconductor device comprising:
a package substrate having a multilayer structure;
a semiconductor chip mounted on a main surface of said package substrate;
wherein said semiconductor chip includes,
an internal circuit;
an I/O circuit interfacing a signal between said internal circuit and an external device;
a first voltage supply electrode which supplies a first operating voltage to said internal circuit; and
a second voltage supply electrode which supplies a second operating voltage, being different from said first operating voltage, to said I/O circuit, and
wherein said package substrate includes,
a first electrode provided on said main surface of said package substrate and being electrically coupled to said first voltage supply electrode of said semiconductor chip;
a second electrode provided on said main surface of said package substrate and being electrically coupled to said second voltage supply electrode of semiconductor chip;
a first wiring plane being formed of a wiring layer which is different from said first and second electrodes and being electrically coupled to said first electrode via a through hole;
a second wiring plane being formed of the same wiring layer as that of the said first wiring plane and being formed outside said first wiring plane and being electrically coupled to said second electrode via a through hole;

a third wiring plane being formed of a wiring layer which is different from both said first and second wiring planes and each of said first and second electrodes, said third wiring plane commonly supplying a reference potential to said internal circuit and said I/O circuit of said semiconductor chip;

third electrodes provided on said back surface opposing to said main surface of said package substrate; and said third electrodes being used as external terminals of said package substrate, wherein said first wiring plane and said second wiring plane are separated from each other in a plane view.

11. The semiconductor device according to claim 10, wherein said semiconductor chip includes a plurality of I/O circuits each of which outputs a signal formed by said internal circuit, said plurality of second voltage supply electrodes which supplies different operating voltages each other to said plurality of I/O circuits.

12. The semiconductor device according to claim 10, wherein said second wiring plane having a plurality of wiring layers which are separated from each other in a plane view.

13. The semiconductor device according to claim 10, wherein said package substrate is provided with a plurality of external terminals which connected via a fourth wiring plane being formed of a wiring layer which is different from said first, second and third wiring plane and each of said first and second electrodes.

14. The semiconductor device according to claim 10, wherein the number aggregated to the number less than said second electrodes is 4 or more, and wherein these 4 or more external terminals are dispersively laid out in areas dividing an area formed with external terminals on the back surface into quarters.

15. The semiconductor device according to claim 14, wherein said first wiring plane which commonly coupled said second electrodes respectively, is electrically isolated and divided into two or more sets and makes it possible to supply different operating voltages from external terminals to their corresponding sets.

16. A semiconductor device comprising:

a package substrate having a plane formed in a quadrangle shape and a multilayer structure;

a semiconductor chip mounted on a main surface of said package substrate;

wherein said semiconductor chip includes, an internal circuit;

an I/O circuit interfacing a signal between said internal circuit and an external device;

a first voltage supply electrode which supplies a first operating voltage to said internal circuit; and a second voltage supply electrode which supplies a second operating voltage, being different from said first operating voltage, to said I/O circuit, and wherein said package substrate includes, a first electrode provided on said main surface of said package substrate and being electrically coupled to said first voltage supply electrode of said semiconductor chip;

a second electrode provided on said main surface of said package substrate and being electrically coupled to said second voltage supply electrode of semiconductor chip;

a first wiring plane being formed of a wiring layer which is different from said first and second electrodes and being electrically coupled to said first electrode via a through hole;

a second wiring plane being formed of the same wiring layer as that of said first wiring plane and being electrically coupled to said second electrode via a through hole;

a third wiring plane being formed of a wiring layer which is different from both said first and second wiring plane and each of said first and second electrodes, said third wiring plane commonly supplying a reference potential to said internal circuit and said I/O circuit of said semiconductor chip;

third electrodes provided on said back surface opposing to said main surface of said package substrate; and said third electrodes being used as external terminals of said package substrate, wherein said external terminals and said second wiring plane are provided between one side of said package substrate and said first wiring plane, wherein said external terminals are provided between said one side of said package substrate and said second wiring plane, wherein said first wiring plane and said second wiring plane are separated from each other in a plane view.

17. The semiconductor device according to claim 16, wherein said external terminals and said second wiring plane are provided between opposite side opposing to said one side of said package substrate and said first wiring plane, wherein said external terminals are provided between said opposite side and said second wiring plane.

18. The semiconductor device according to claim 16, wherein said package substrate is provided with a plurality of external terminals which connected via a fourth wiring plane being formed of a wiring layer which is different from said first, second and third wiring plane and each of said first and second electrodes.

19. The semiconductor device according to claim 16, wherein the number aggregated to the number less than said second electrodes is 4 or more, and wherein these 4 or more external terminals are dispersively laid out in areas obtained by dividing an area formed with external terminals on the back surface into quarters.

20. The semiconductor device according to claim 19, wherein said first wiring plane which commonly coupled said second electrodes respectively, is electrically isolated and divided into two or more sets and makes it possible to supply different operating voltages from external terminals to their corresponding sets.

* * * * *